(12) United States Patent
Tsai

(10) Patent No.: US 9,496,882 B2
(45) Date of Patent: Nov. 15, 2016

(54) DIGITALLY CONTROLLED OSCILLATOR

(71) Applicant: TAIWAN SEMICONDUCTOR MANUFACTURING COMPANY LTD., Hsinchu (TW)

(72) Inventor: Tsung-Hsien Tsai, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/497,890

(22) Filed: Sep. 26, 2014

(65) Prior Publication Data
US 2016/0072514 A1    Mar. 10, 2016

Related U.S. Application Data

(60) Provisional application No. 62/046,320, filed on Sep. 5, 2014.

(51) Int. Cl.
| | |
|---|---|
| *H03L 7/00* | (2006.01) |
| *H03L 7/099* | (2006.01) |
| *H03K 3/011* | (2006.01) |
| *H03K 5/13* | (2014.01) |
| *H03B 27/00* | (2006.01) |
| *H03L 7/08* | (2006.01) |
| *H03L 1/00* | (2006.01) |
| *H03L 7/093* | (2006.01) |

(52) U.S. Cl.
CPC ............. *H03L 7/0995* (2013.01); *H03B 27/00* (2013.01); *H03K 3/011* (2013.01); *H03K 5/133* (2013.01); *H03L 7/099* (2013.01); *H03L 1/00* (2013.01); *H03L 7/0802* (2013.01); *H03L 7/093* (2013.01); *H03L 7/0994* (2013.01); *H03L 7/0997* (2013.01); *H03L 2207/50* (2013.01)

(58) Field of Classification Search
CPC ............... H03K 3/0315; H03K 5/133; H03K 2005/00156; H03K 3/0322; H03K 3/011; G04F 10/005; H03L 7/0802; H03L 7/0994; H03L 7/0997; H03B 27/00
USPC ..................................... 331/2, 46, 55, 57, 50
See application file for complete search history.

(56) References Cited

U.S. PATENT DOCUMENTS

| | | | |
|---|---|---|---|
| 2007/0182493 A1* | 8/2007 | Sai ......................... | H03L 7/0995 331/2 |
| 2015/0214955 A1* | 7/2015 | Calhoun .................. | G06F 1/04 331/47 |

* cited by examiner

*Primary Examiner* — Arnold Kinkead
(74) *Attorney, Agent, or Firm* — WPAT, P.C., Intellectual Property Attorneys; Anthony King

(57) ABSTRACT

In some embodiments, a digitally controlled oscillator includes a first oscillator a second oscillator and a switch. The second oscillator is selectively enabled in response to a controlled signal. The switch is coupled between the first oscillator and the second oscillator and is selectively conducted in response to the controlled signal, so that an oscillator signal is provided by the first oscillator when the switch is not conducted, and provided by the first oscillator and the second oscillator when the switch is conducted.

19 Claims, 20 Drawing Sheets

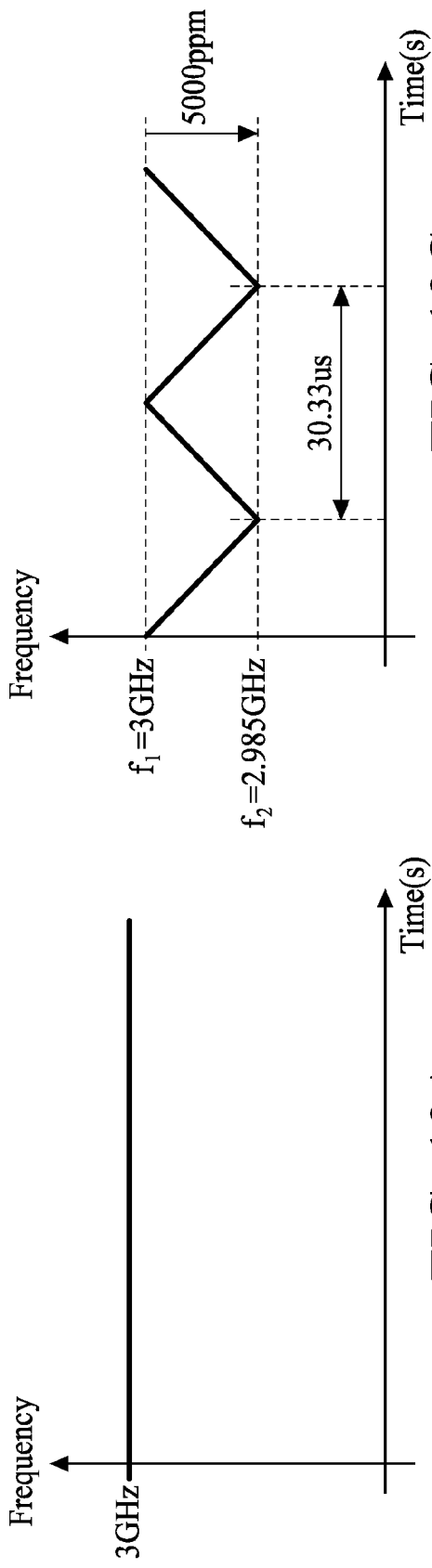
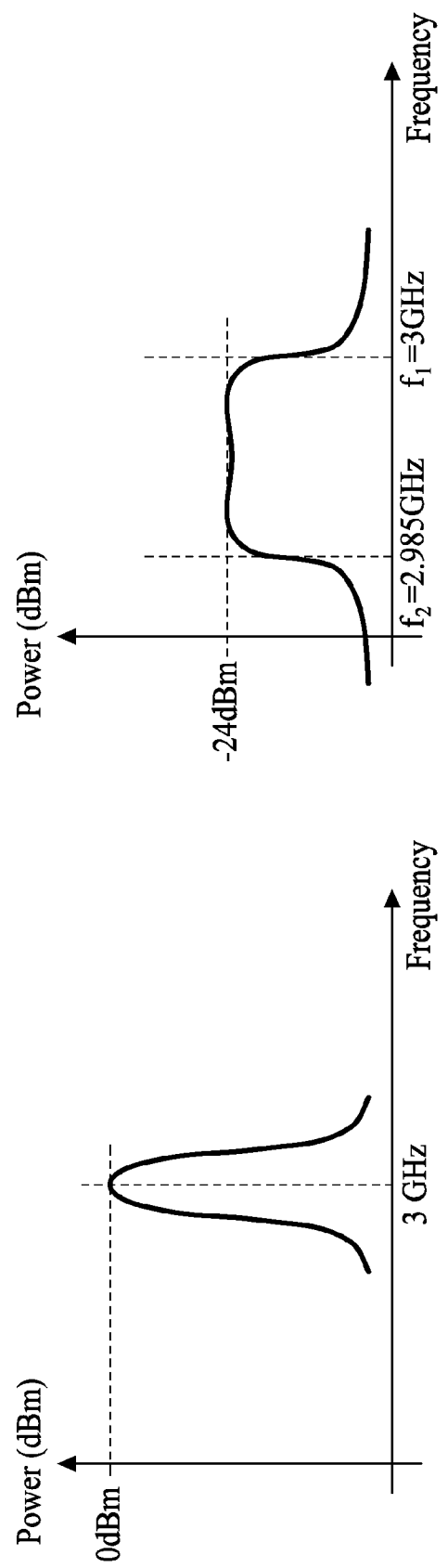
FIG. 12A
FIG. 12B
FIG. 12C
FIG. 12D

DIGITALLY CONTROLLED OSCILLATOR

PRIORITY CLAIM AND CROSS-REFERENCE

This application claims the benefit of provisional application Ser. 62/046,320 filed on Sep. 5, 2014, entitled "DIGITALLY CONTROLLED OSCILLATOR," the disclosure of which is hereby incorporated by reference in its entirety

BACKGROUND

Phase locked loop (PLL) is an important device in communication. A PLL outputs an oscillator signal that is stabilized, or locked, with respect to a phase and a frequency of an input reference signal. Nowadays, all-digital PLL (ADPLL) has been researched and developed to replace analog PLL because ADPLL is free from large analog loop filters and passive elements, and has much lower parameter variability and a fast design turn-around cycle using automated computer aided design (CAD) tools. Among the digital components of the ADPLL, a digital-controlled oscillator (DCO) is a component that actually generates the oscillator signal in response to control blocks in the ADPLL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12A is a schematic diagram showing an exemplary signal before spread spectrum (SS).

FIG. 12B is a diagram showing a spectrum of the signal of FIG. 12A.

FIG. 12C is a schematic diagram showing the signal after SS.

FIG. 12D is a diagram showing a spectrum of the signal of FIG. 12C.

DETAILED DESCRIPTION

Figure 1:
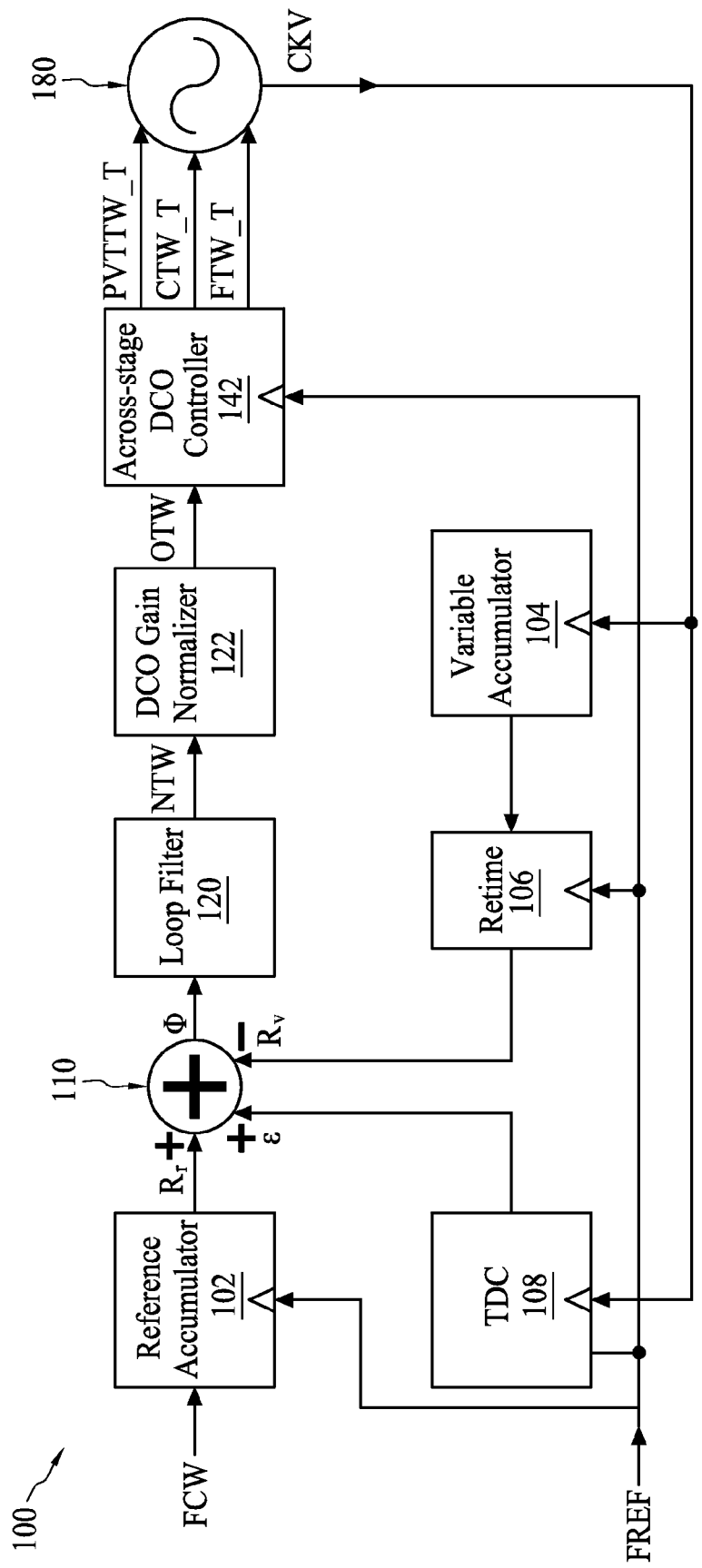
FIG. 1 is a block diagram of an all-digital phase locked loop (ADPLL), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present. In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device. An active edge of a clock signal can either be a positive edge or a negative edge.

FIG. 1 is a block diagram of an all-digital phase locked loop (ADPLL) 100, in accordance with some embodiments. The ADPLL 100 includes a reference accumulator 102, a time-to-digital converter (TDC) 108, a variable accumulator 104, a retime element 106 and a summing element 110 for generating a phase error Φ, a loop filer 120 and a DCO-gain normalizer for converting the phase error Φ into an oscillator tuning code OTW, an across-stage DCO controller 142 for producing tuning codes PVTTW_T, CTW_T and FTW_T that control a DCO 180 at different frequency step sizes, respectively, and the DCO 180 which generates an oscillator signal CKV tuned in accordance with the tuning codes PVTTW_T, CTW_T and FTW_T.

The reference accumulator 102 receives a reference signal FREF and a frequency control code FCW, which is the ratio of the desired frequency of the oscillator signal CKV divided by the frequency of the reference signal FREF. The reference accumulator 102 generates a reference phase signal $R_r$, which is an accumulation of the frequency control code FCW at an active edge of the reference signal FREF.

The TDC 108 determines a time difference between active edges of the oscillator signal CKV and the reference signal FREF, represents the time difference as a digital value and normalizes the phase difference as a fraction of a clock cycle of the oscillator signal CKV to generate a fractional error ε.

The variable accumulator 104 increments a count on each active edge of the oscillator signal CKV, and the retime element 106 latches the count at each active edge of the reference signal FREF.

The summing element 110 determines the phase error Φ as $R_r-(R_v-\epsilon)$. Depending on the amount of the phase error Φ, the ADPLL 100 enters different tuning stages. The different tuning stages include a PVT tuning stage, a coarse tuning stage and a fine tuning stage which are listed in the order of descending covering frequency ranges and also in the order of descending frequency step sizes. The ADPLL 100 enters the stages in sequence. As the ADPLL 100 settles in the PVT tuning stage and enters the coarse tuning stage, the ADPLL 100, for example, begins the covering frequency range at an output frequency CKV(f) settled in the previous stage, i.e., the PVT tuning stage, and tunes the output frequency CKV(f) with a step size finer than that in the PVT tuning stage. As the ADPLL 100 settles in the coarse tuning stage and enters the fine tuning stage, the ADPLL 100, for example, beings the covering frequency range at an output frequency CKV(f) settled in the previous stage, i.e. the coarse tuning stage, and tunes the output frequency CKV(f) with a step size finer than that in the coarse tuning stage.

The loop filter 120 controls a normalized tuning code NTW depending on the phase error Φ. The loop filter 120 can be set so that time for the ADPLL 100 to be settled in, for example, the PVT tuning stage and the coarse tuning stage can be faster than that of the fine tuning stage. In addition, the loop filter 120 also includes a low-pass filter for attenuating unwanted spurs and phase noise at higher frequencies.

The DCO gain normalizer 122 normalizes the normalized tuning code NTW into the oscillator tuning code OTW by multiplying the normalized tuning code NTW with the reference frequency FREF(f) divided by a DCO gain. The DCO gain corresponds to a DCO resolution, i.e. how much the output frequency is changed by an LSB integer change of the oscillator tuning code OTW. Because the DCO operating in different stages has different frequency covering ranges, the DCO gain will be different in each stage.

The across-stage DCO controller 142 receives the oscillator tuning code OTW and provides the tuning codes including retimed PVT tuning code PVTTW_T, retimed coarse tuning code CTW_T and retimed fine tuning code FTW_T. At the PVT tuning stage, the oscillator tuning code OTW is used for generating the PVT tuning code PVTTW_T. The coarse tuning code CTW_T and the fine tuning code FTW_T remain default. After the ADPLL 100 settles in the PVT tuning stage, the ADPLL 100 enters the coarse tuning stage. At the coarse tuning stage, the oscillator tuning code OTW is used for generating the coarse tuning code CTW_T. The PVT tuning code PVTTW_T remains the settled value in the previous stage and the fine tuning code FTW_T remains default. After the ADPLL 100 settles in the coarse tuning stage, the ADPLL 100 enters the fine tuning stage. At the fine tuning stage, the oscillator tuning code OTW is used for generating the fine tuning code FTW_T. The PVT tuning code PVTTW_T and the coarse tuning code CTW_T remain settled values in the previous stages. After the ADPLL 100 settles in the fine tuning stage, the ADPLL 100 remains in the fine tuning stage so that the output frequency can be adjusted in response to PVT variations.

PVT variations such as a temperature variation can cause the settled output frequency CKV(f) in the fine tuning stage to deviate from the reference frequency FREF(f). When the across-stage DCO controller 142 detects that deviation cannot be covered by the frequency covering range of the fine tuning stage, the across-stage DCO controller 142 automatically adjusts the coarse tuning code CTW_T from the coarse tuning stage.

The DCO 180 converts the tuning codes PVTTW_T, CTW_T and FTW_T into the output frequency CKV(f) of the oscillator signal CKV. In some embodiments, the DCO 180 includes cascaded delay stages each include driver elements and capacitive elements that can be switched on or off in response to the corresponding tuning code PVTTW_T, CTW_T or FTW_T. In some embodiments, the frequency covering range of each tuning stage is determined by number of elements in each delay stage that can be controlled by the corresponding tuning code.

Figure 2:
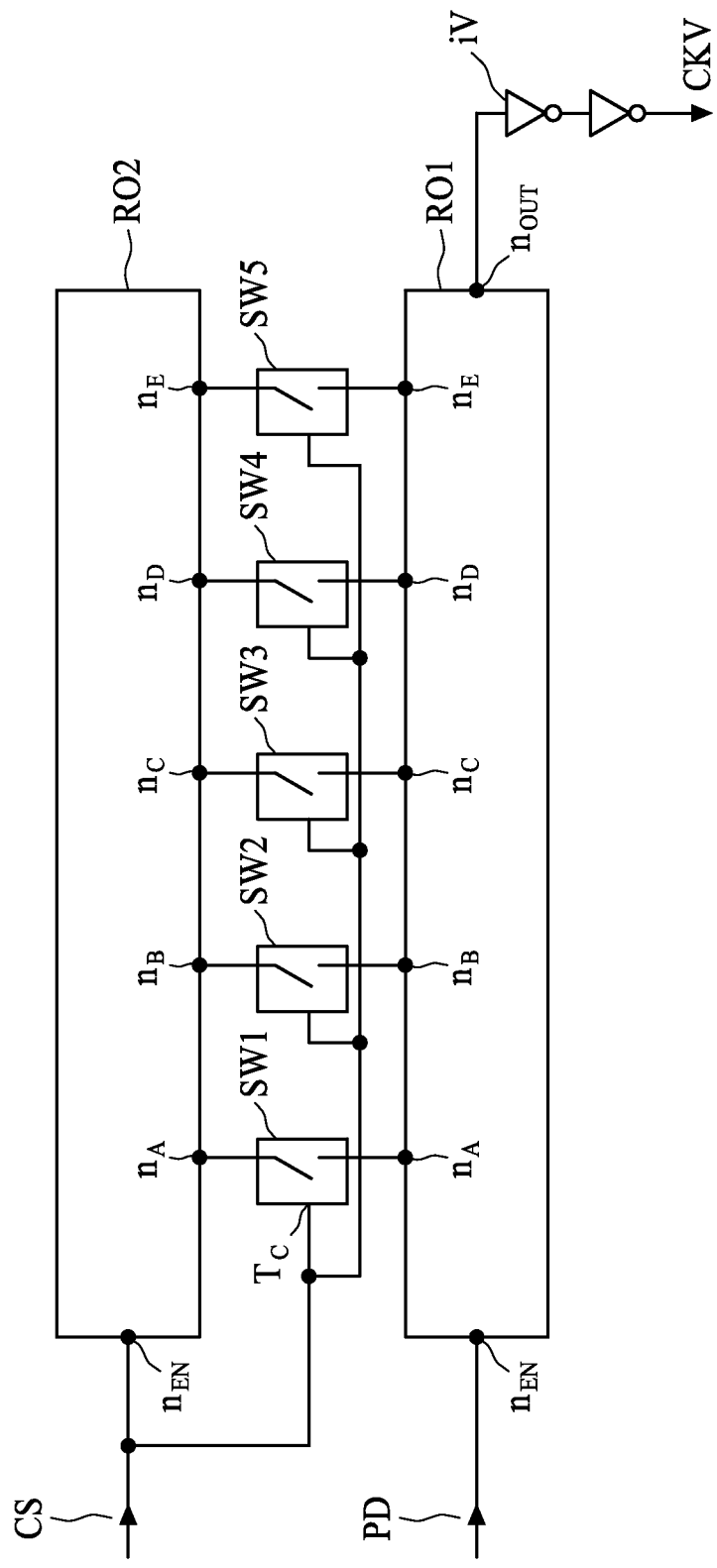
FIG. 2 is a block diagram of a digitally controlled oscillator (DCO), in accordance with some embodiments.

FIG. 2 is a block diagram of a digitally controlled oscillator (DCO) 200, in accordance with some embodiments. Referring to FIG. 2, the DCO 200 includes oscillators RO1 and RO2 and switches SW1, SW2, SW3, SW4 and SW5. The number of switches is only exemplary, and the disclosure is not limited thereto. In some embodiments, the DCO 200 further includes two inverters iv coupled to an output terminal $n_{OUT}$ of the oscillator RO1.

The oscillator RO1 is connected to switches SW1-SW5 at its terminals $n_A$ to $n_E$. Moreover, the oscillator RO1 receives a power detection signal PD at an enable terminal $n_{EN}$, and outputs an oscillator signal CKV at the output terminal $n_{OUT}$. The power detection signal PD is used to indicate that, for example, the ADPLL 100 is powered on or the DCO 200 is powered on. In response to the power detection signal PD, the DCO 200 outputs the oscillator signal CKV. In some embodiments, the oscillator RO1 includes a ring oscillator.

The oscillator RO2 is connected to switches SW1-SW5 at its terminals $n_A$ to $n_E$. Moreover, the oscillator RO2 receives a controlled signal CS at an enable terminal $n_{EN}$. In some embodiments, the oscillator RO2 includes a ring oscillator.

The switch SW1 is coupled between the terminals $n_A$ of the oscillator RO1 and the oscillator RO2. The switch SW2 is coupled between the terminals $n_B$ of the oscillator RO1 and the oscillator RO2. The switch SW3 is coupled between the terminals $n_C$ of the oscillator RO1 and the oscillator RO2. The switch SW4 is coupled between the terminals $n_D$ of the oscillator RO1 and the oscillator RO2. The switch SW5 is coupled between the terminals $n_E$ of the oscillator RO1 and the oscillator RO2. Each of the switches SW1-SW5 includes a control terminal Tc for receiving the controlled signal CS. In some embodiments, the switches SW1-SW5 include transmission gates.

In operation, the oscillator RO2 is selectively enabled in response to the controlled signal CS, and the switches SW1-SW5 are selectively conducted in response to the controlled signal CS. In low-power applications, the oscillator RO2 is not enabled in response to a first state, such as a logically low state, of the controlled signal CS. Moreover, the switches SW1-SW5 are not conducted in response to the first state of the controlled signal CS. In low-phase-noise applications, the oscillator RO2 is enabled in response to a second state, such as a logically high state, of the controlled signal CS. Moreover, the switches SW1-SW5 are conducted in response to the second state of the controlled signal CS.

With the two oscillators RO1 and RO2, the DCO 200 provides an option for a user to choose between the low-power and low-phase-noise applications. In the low-power applications, the DCO 200 consumes relatively low power consumption. In contrast, in the low-phase-noise applications, the DCO 200 generates the oscillator signal CKV with a relatively low noise phase. Operation of the DCO 200 will be described in detail with reference to FIGS. 4A and 4B below.

Figure 3:
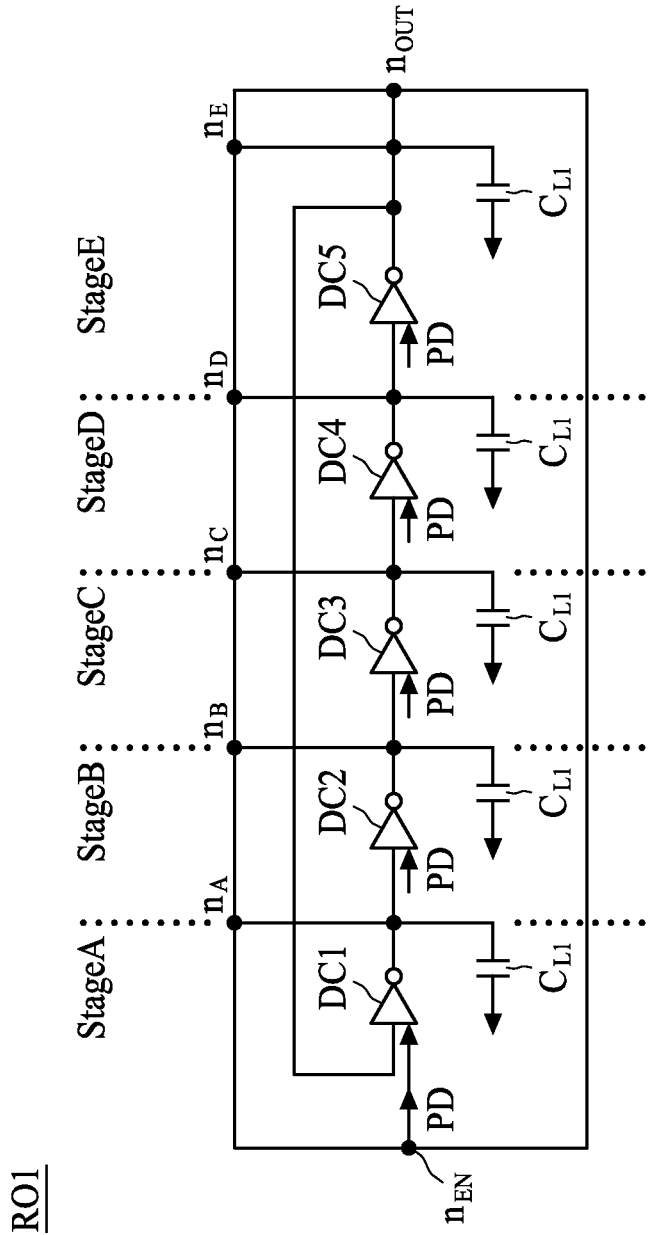
FIG. 3 is a circuit diagram of an oscillator of the DCO illustrated in FIG. 2, in accordance with some embodiments.

FIG. 3 is a circuit diagram of the oscillator RO1 of the DCO 200 illustrated in FIG. 2, in accordance with some embodiments. Referring to FIG. 3, the oscillator RO1 includes but is not limited to five stages, stages A to E. Each of the stages includes a delay cell. As a result, the oscillator RO1 includes five delay cells DC1-DC5. Each of the delay cells DC1-DC5 includes two inputs and one output. In the present embodiment, the delay cells DC1-DC5 are connected in series in a ring configuration. Accordingly, the delay cell DC1 includes an input coupled to the enable terminal $n_{EN}$, another input coupled to an output of the delay cell DC5, and an output coupled to the terminal $n_A$ and an input of the delay cell DC2.

The delay cell DC2 includes an input coupled to the enable terminal $n_{EN}$, another input coupled to the terminal $n_A$ and the output of delay cell DC1, and an output coupled to the terminal $n_B$.

Similarly, the delay cell DC3 includes an input coupled to the enable terminal $n_{EN}$, another input coupled to the terminal $n_B$ and the output of delay cell DC2, and an output coupled to the terminal $n_C$.

Similarly, the delay cell DC4 includes an input coupled to the enable terminal $n_{EN}$, another input coupled to the terminal $n_C$ and the output of delay cell DC3, and an output coupled to the terminal $n_D$.

The delay cell DC5 includes an input coupled to the enable terminal $n_{EN}$, another input coupled to the terminal $n_D$ and the output of delay cell DC4, and an output coupled to the terminal $n_E$ and the output terminal $n_{OUT}$.

Furthermore, each of the stages A-E includes a capacitor $C_{L1}$. In some embodiments, the capacitors $C_{L1}$ represent parasitic capacitors having a wire capacitance. As an example of the delay cell DC1, one terminal of the capacitor $C_{L1}$ is coupled to a reference ground, and the other terminal of the capacitor $C_{L1}$ is coupled to the output of delay cell DC1 at terminal $n_A$. In some embodiments, the capacitors $C_{L1}$ at the stages A-E have substantially the same capacitance.

Figure 4A:
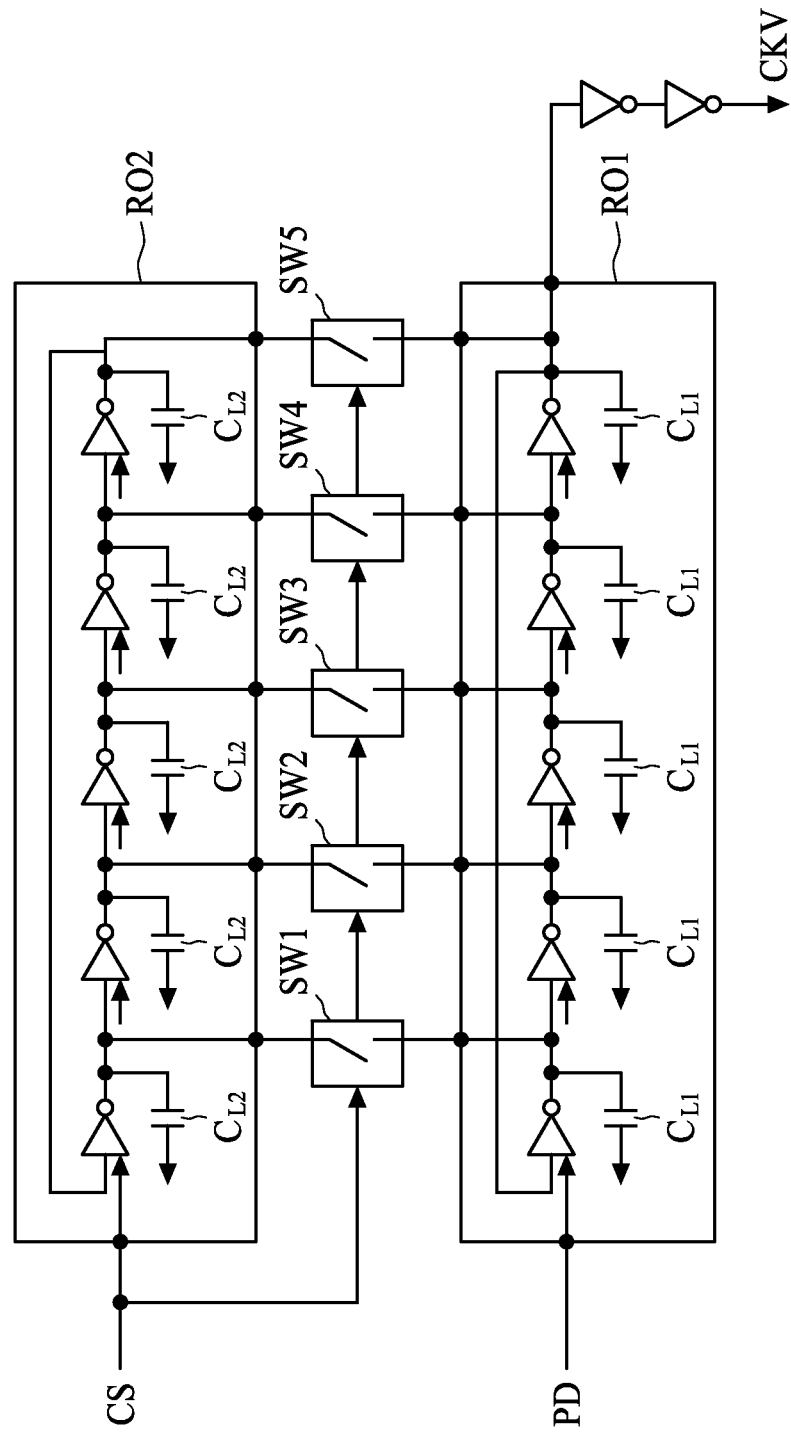
FIG. 4A is a schematic diagram illustrating an operation of the DCO of FIG. 2, in accordance with some embodiments.
Figure 4B:
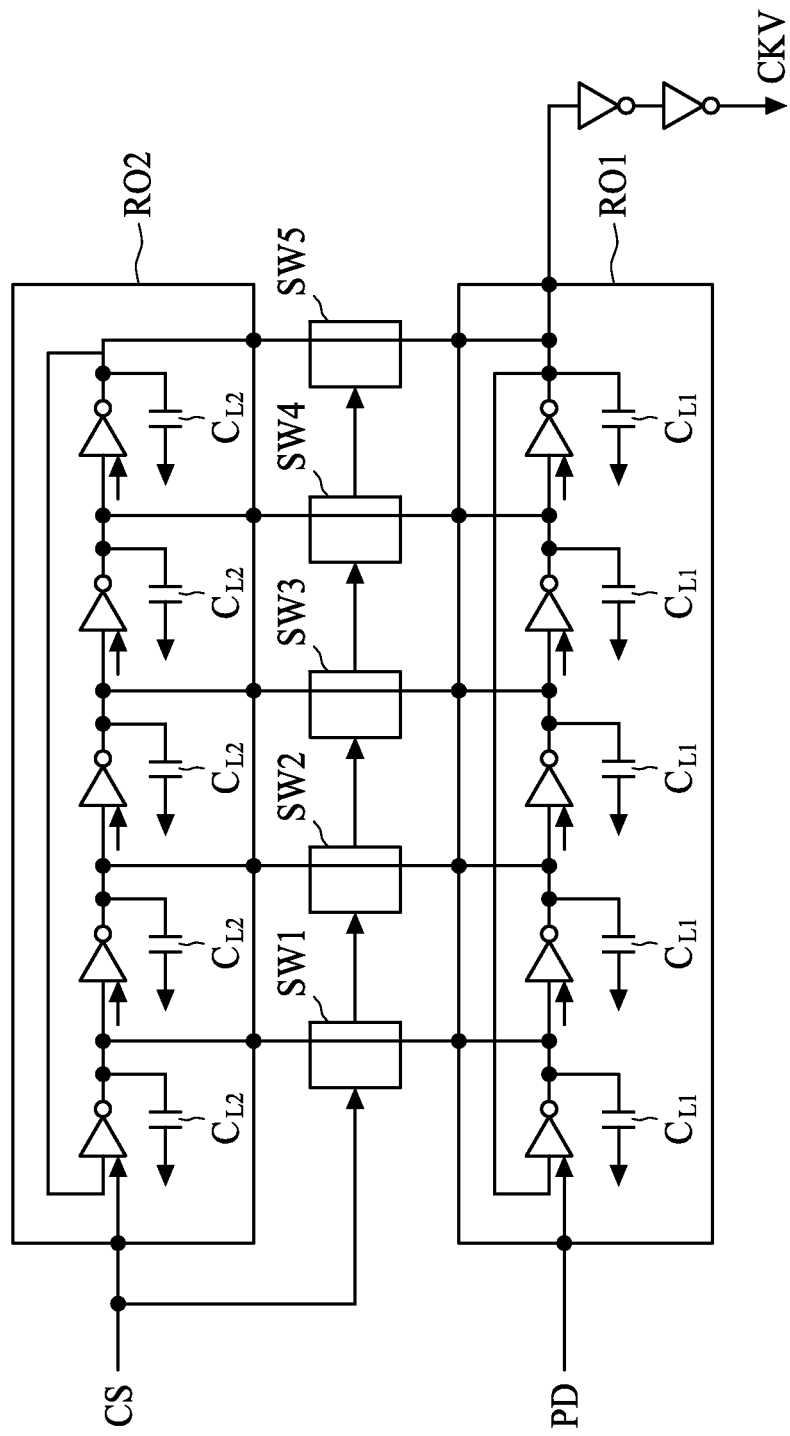
FIG. 4B is a schematic diagram illustrating another operation of the DCO of FIG. 2, in accordance with some embodiments.

Although not shown in FIG. 3, the oscillator RO2 in FIG. 2 is similar in circuit structure to the oscillator RO1 expect that, for example, an input terminal of each of the delay cells of the oscillator RO2 receives the controlled signal CS instead of the power detection signal PD. Likewise, the oscillator RO2 also includes five stages A-E, each including a capacitor $C_{L2}$ as shown in FIG. 4A and FIG. 4B.

Generally, an equivalent capacitor of the inner structure of the DCO 200 affects both phase noise and power consumption. The capacitance of the capacitor $C_{L1}$ of each of the stages A-E is a part of the equivalent capacitor of the DCO 200. Therefore, the capacitance of the capacitor $C_{L1}$ of each of the stages A-E also affects phase noise and power consumption. More specifically, relation between the output frequency CKV(f) of the oscillator signal CKV and the equivalent capacitor of the DCO 200 can be expressed in equation (1) below.

$$f_{OSC} \propto \frac{I_{DCO}}{(V_{DD} - V_{TH}) \times C_L} \quad \text{equation (1)}$$

where $f_{OSC}$ represents the output frequency CKV(f), $I_{DCO}$ represents an operation current of the DCO 200, $V_{DD}$ represents a power supply voltage for the DCO 200, $V_{TH}$ represents a threshold voltage, and $C_L$ represents an equivalent capacitor of the DCO 200.

In equation (1), it is assumed that the frequency $f_{OSC}$ is kept substantially fixed. Accordingly, the capacitance of the equivalent capacitor $C_L$ of the DCO 200 increases as the operation current $I_{DCO}$ increases. Moreover, as the operation current $I_{DCO}$ increases, the power consumption of the DCO 200 increases.

Moreover, the phase noise of the oscillator signal CKV can be expressed in equation (2) below.

$$s_\Phi(\Delta f) \propto \frac{1}{I_{DCO}} \quad \text{equation (2)}$$

where $S_\Phi(\Delta f)$ represents a phase noise value of the oscillator signal CKV, and $\Delta f$ represents the offset frequency from center frequency of the oscillator signal CKV.

Equation (2) reveals that a larger the operation current $I_{DCO}$ results in a smaller phase noise $S_\Phi(\Delta f)$ and thus a better performance of noise control.

FIG. 4A is a schematic diagram illustrating an operation of the DCO 200 of FIG. 2, in accordance with some embodiments. Referring to FIG. 4A, in response to, for example, a logical low state of the controlled signal CS, the oscillator RO2 is not enabled and the switches SW1-SW5 are not conducted. As a result, the DCO 200 operates in the low-power mode.

FIG. 4B is a schematic diagram illustrating another operation of the DCO 200 of FIG. 2, in accordance with some embodiments. Referring to FIG. 4B, in response to a logical high state of the controlled signal CS, the oscillator RO2 is enabled and the switches SW1-SW5 are conducted. More specifically, each of the delay cells of the oscillator RO2 is not conducted in response to the controlled signal CS. As a result, the DCO 200 operates in the low-phase-noise mode.

In comparison, the capacitance of the equivalent capacitor $C_L$ in FIG. 4B is greater than that of the equivalent $C_L$ in FIG. 4A because in FIG. 4B the capacitor $C_{L1}$ is connected in parallel with the capacitor $C_{L2}$. Given the same $f_{OSC}$, $I_{DCO}$ in FIG. 4B is greater than that in FIG. 4A according to equation (1), and hence $S_\Phi(\Delta f)$ in FIG. 4B is smaller than that in FIG. 4A according to equation (2). Consequently, the phase noise of the oscillator signal CKV in FIG. 4B is lower than that of the oscillator CKV in FIG. 4A.

On the other hand, since the operation current $I_{DCO}$ in FIG. 4A is smaller than that in FIG. 4B, the power consumption of the DCO 200 in FIG. 4A is lower than that of the DCO 200 in FIG. 4B. Effectively, the DCO 200 can serve as a low-power DCO or a low-phase-noise DCO, depending on a desired application. In some existing approaches, however, a DCO can only serve for either low power consumption or for low noise phase because the DCO includes a single oscillator.

Figure 5:
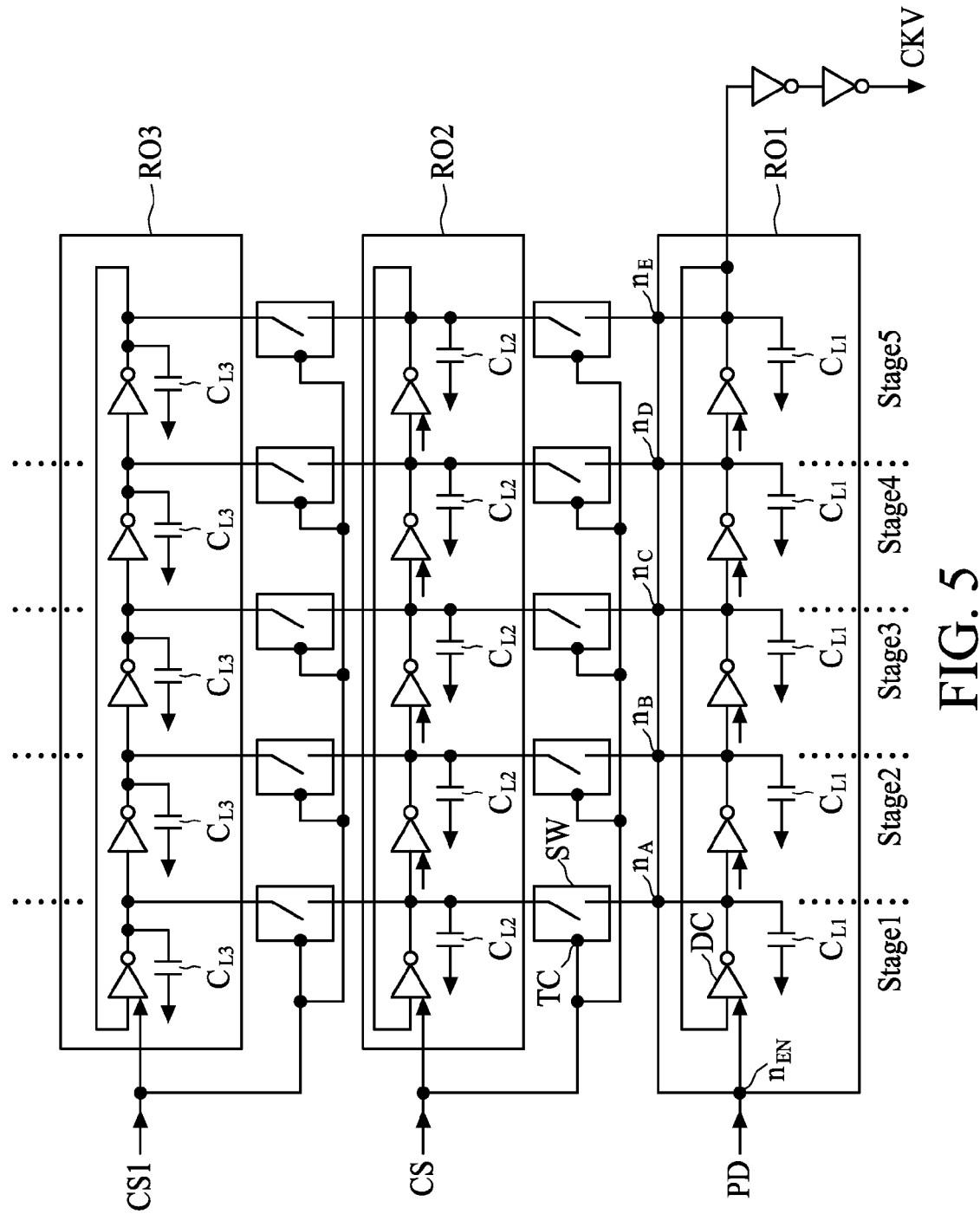
FIG. 5 is a circuit diagram of a DCO, in accordance with some embodiments.

FIG. 5 is a circuit diagram of a DCO 500, in accordance with some embodiments. The DCO 500 is similar to the DCO 200 described and illustrated with reference to FIG. 2 except that, for example, the DCO 500 further includes an oscillator RO3 and a set of switches between the oscillators RO2 and RO3. The switches between the oscillator RO3 and the oscillator RO2 are selectively conducted in response to a controlled signal CS1. The operation of the switches between the oscillators RO2 and RO3 is similar to that of the switches SW1-SW5 described and illustrated with reference to FIGS. 4A and 4B and it is discussed.

The oscillator RO3 is selectively enabled in response to the controlled signal CS1. In some embodiments, the oscillator RO3 is enabled in response to a high logic state of the controlled signal CS1, and is disabled in response to a low logic state of the controlled signal CS1.

With the three oscillators RO1, RO2 and RO3, the DCO 500 can serve as a low-phase-noise DCO, a low-power-consumption DCO, or a DCO that outputs the oscillator signal CKV with relatively low phase noise at relatively low power consumption. Operation of the DCO 500 is described in detail with reference to FIGS. 6A to 6C below.

Figure 6A:
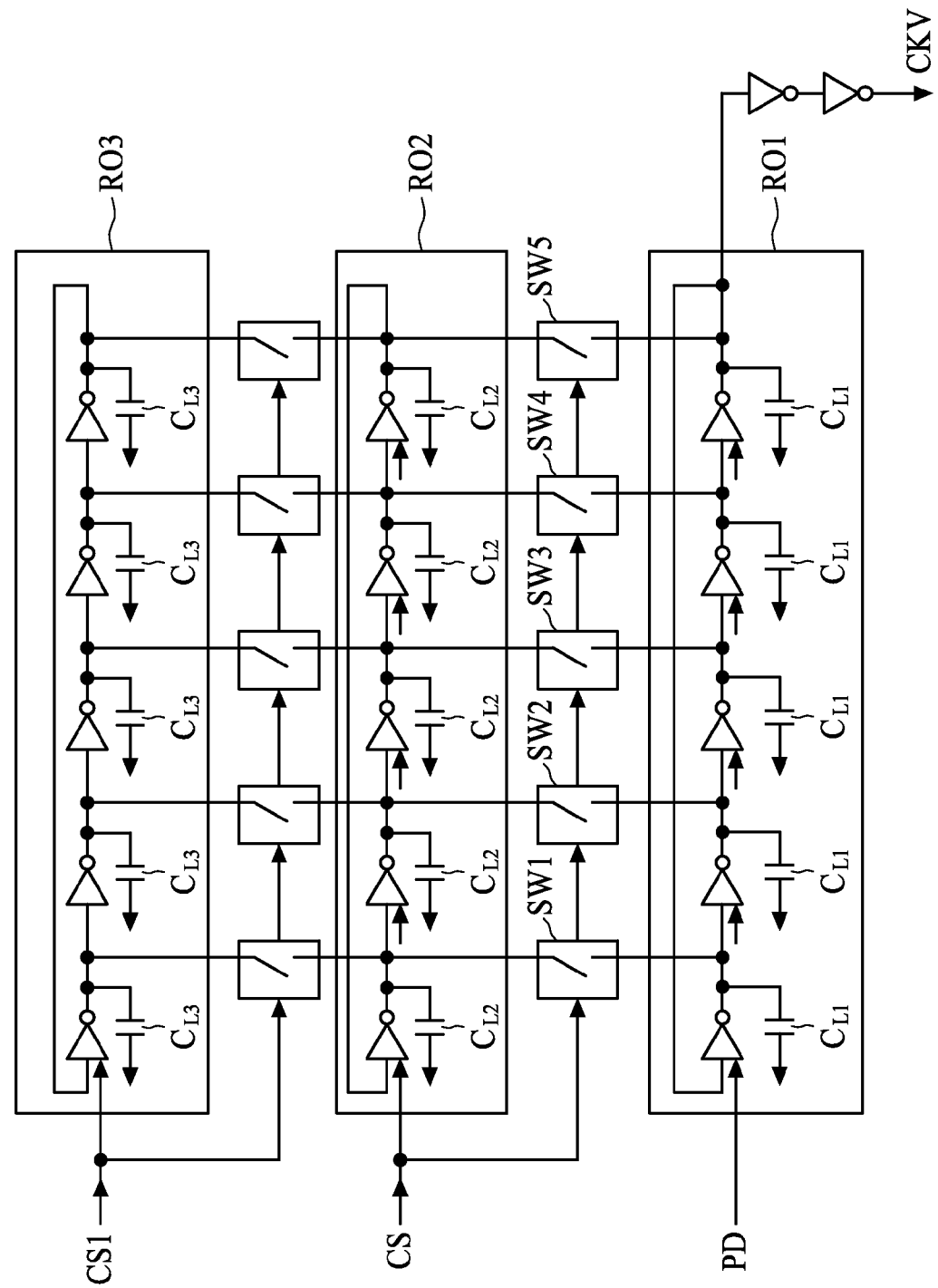
FIG. 6A is a schematic diagram illustrating an operation of the DCO of FIG. 5, in accordance with some embodiments.

FIG. 6A is a schematic diagram illustrating an operation of the DCO 500 of FIG. 5, in accordance with some embodiments. Referring to FIG. 6A, in response to a logical low state of the controlled signal CS, the switches SW1-SW5 are not conducted and the oscillator RO2 is not enabled. Moreover, in response to a logical low state of the controlled signal CS1, the switches between the oscillators RO2 and RO3 are not conducted and the oscillator RO3 is not enabled. As a result, the capacitor $C_{L1}$ is not connected in parallel with the capacitor $C_{L2}$ or the capacitor $C_{L3}$.

Figure 6B:
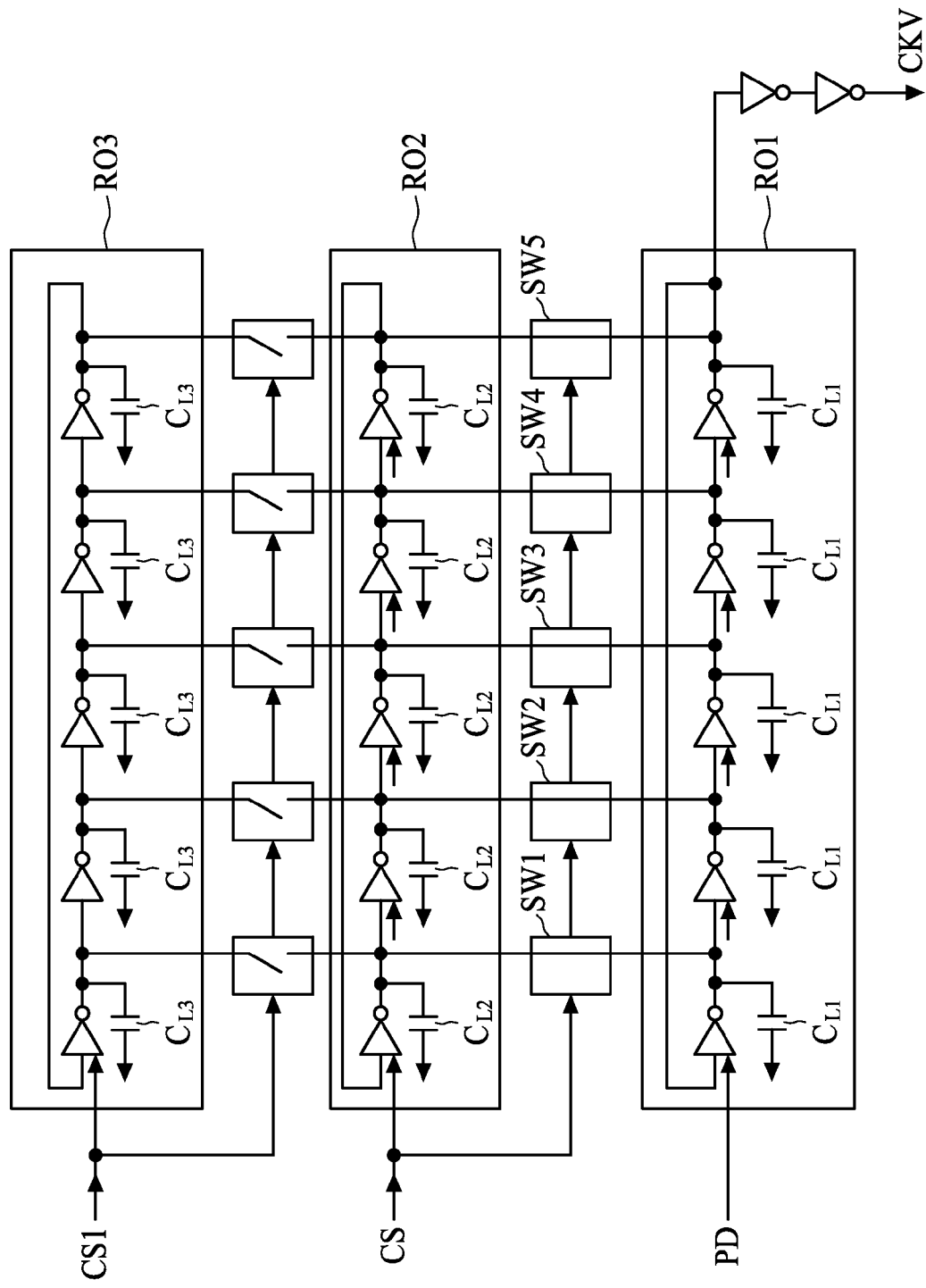
FIG. 6B is a schematic diagram illustrating another operation of the DCO of FIG. 5, in accordance with some embodiments.

FIG. 6B is a schematic diagram illustrating an operation of the DCO 500 of FIG. 5, in accordance with some embodiments. Referring to FIG. 6B, in response to a logical high state of the controlled signal CS, the switches SW1-SW5 are conducted and the oscillator RO2 is enabled. Moreover, in response to a logical low state of the controlled signal CS1, the switches between the oscillators RO2 and RO3 are not conducted and the oscillator RO3 is not enabled. As a result, the capacitor $C_{L1}$ is connected in parallel with the capacitor $C_{L2}$, and is not connected in parallel with the capacitor $C_{L3}$.

Figure 6C:
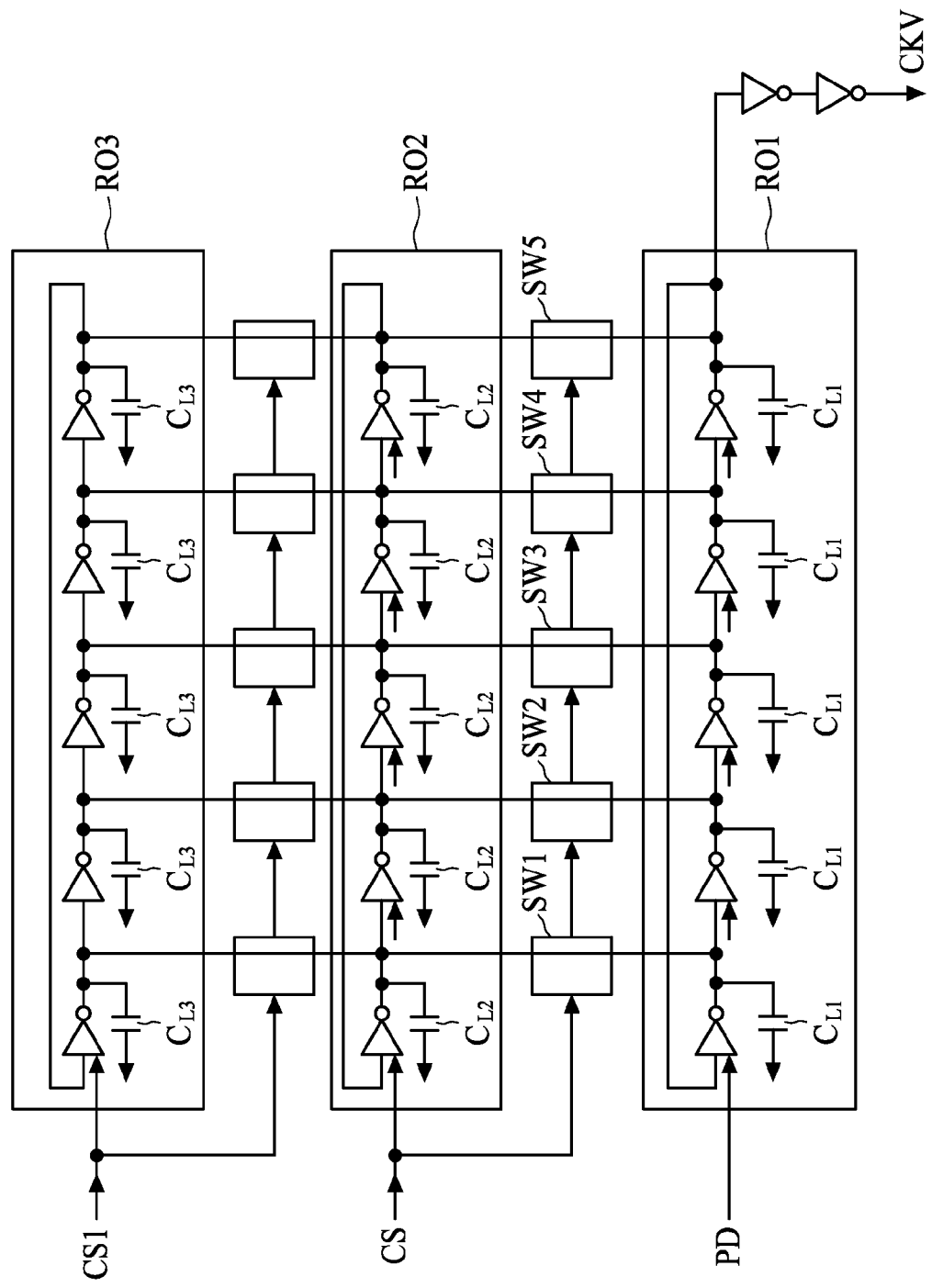
FIG. 6C is a schematic diagram illustrating still another operation of the DCO of FIG. 5, in accordance with some embodiments.

FIG. 6C is a schematic diagram illustrating an operation of the DCO 500 of FIG. 5, in accordance with some embodiments. Referring to FIG. 6C, in response to a logical high state of the controlled signal CS, the switches SW1-SW5 are conducted and the oscillator RO2 is enabled. Moreover, in response to a logical high state of the controlled signal CS1, the switches between the oscillators RO2 and RO3 are conducted and the oscillator RO3 is enabled. As a result, the capacitor $C_{L1}$ is connected in parallel with the capacitor $C_{L2}$ and the capacitor $C_{L3}$.

The different scenarios shown in FIGS. 6A-6C result in different operation currents $I_{DCO}$ and phase noises $S_\Phi(\Delta f)$ of the DCO 500, as listed in Table 1 below.

TABLE 1

| the number of operating oscillator at work | resultant $C_L$ | total operation current | phase noise |
| --- | --- | --- | --- |
| ×1 (FIG. 6A) | ×1 ($C_{L1}$) | 1.85 mA | −113 dBc/Hz |
| ×2 (FIG. 6B) | ×2 ($C_{L1} + C_{L2}$) | 3.88 mA | −116.2 dBc/Hz |
| ×3 (FIG. 6C) | ×3 ($C_{L1} + C_{L2} + C_{L3}$) | 5.8 mA | −118 dBc/Hz |

Based on Table 1, the operation current is the smallest when the DCO 500 is operated in the scenario of FIG. 6A, and phase noise is the lowest when the DCO is operated in the scenario of FIG. 6C. Effectively, the DCO 500 provides options for a user to choose among low-power and low-phase-noise applications.

Figure 7:
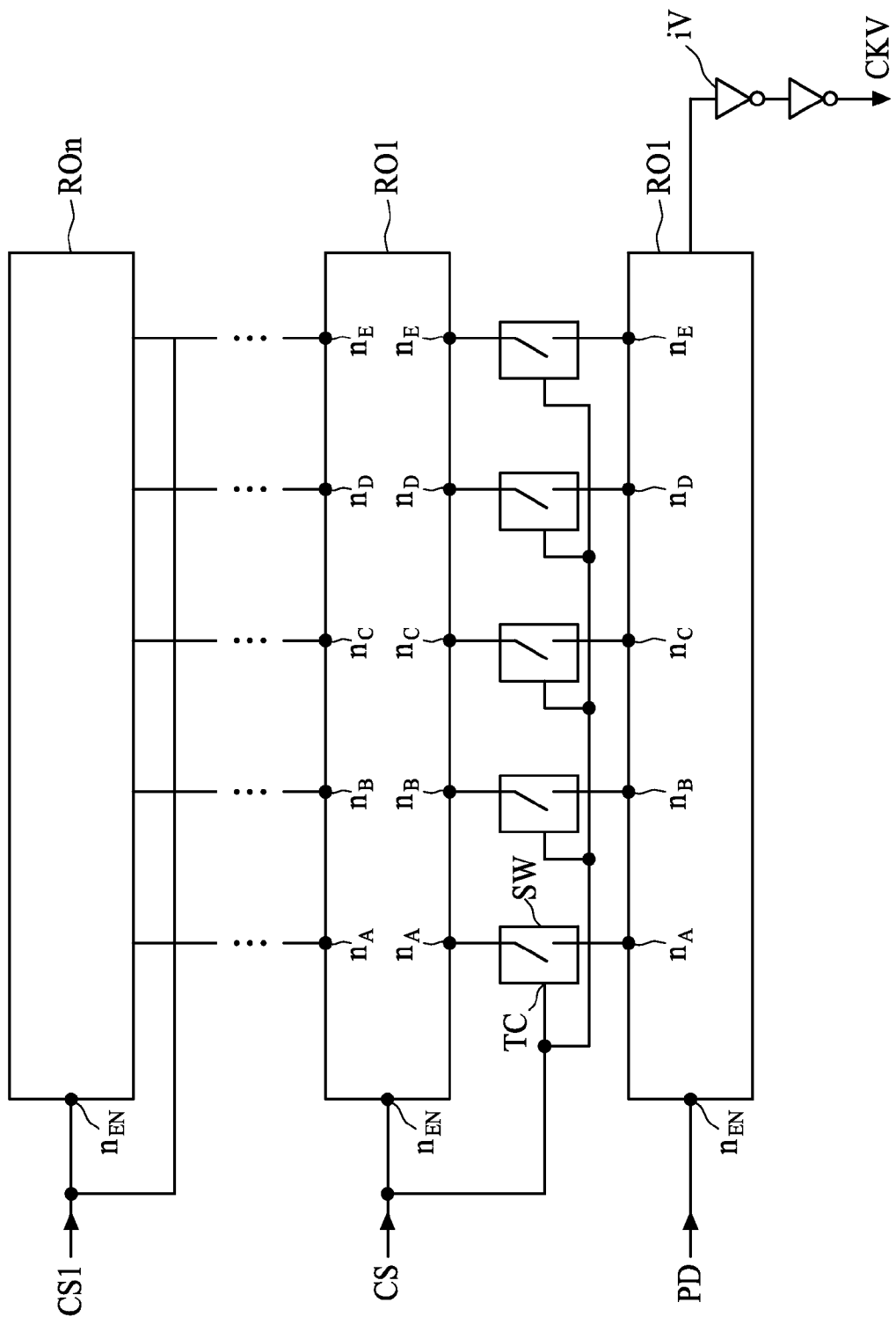
FIG. 7 is a block diagram of a DCO, in accordance with some embodiments.

FIG. 7 is a block diagram of a DCO 700, in accordance with some embodiments. Referring to FIG. 7, the DCO 700 is similar to the DCO 500 described and illustrated with reference to FIG. 5 except that, for example, the DCO 700 includes "n" oscillators and "n−1" sets of switches, n being a natural number greater than three. Compared with the DCO 500, the DCO 700 provides more options for a user to choose among low-power and low-phase-noise applications.

Figure 8:
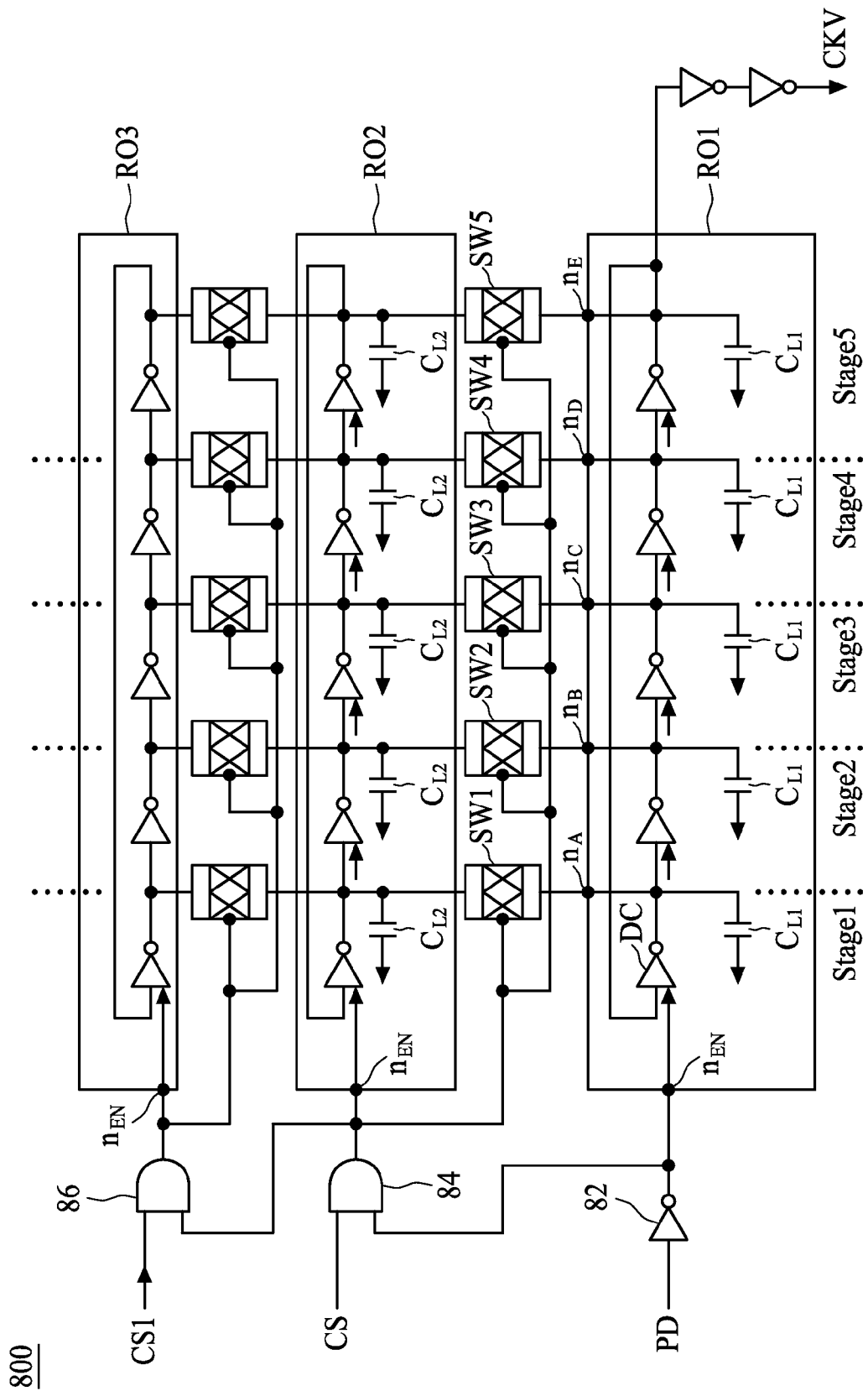
FIG. 8 is a circuit diagram of a DCO, in accordance with some embodiments.

FIG. 8 is a circuit diagram of a DCO 800, in accordance with some embodiments. Referring to FIG. 8, the DCO 800 is similar to the DCO 500 described and illustrated with reference to FIG. 5 except that, for example, the DCO 800 further includes an inverter 82 and logic AND gates 84 and 86.

The inverter 82 includes an input to receive the power detection signal PD and an output coupled to the enable terminal $n_{EN}$ of the first oscillator RO1.

The logic AND gate 84 includes an input to receive the controlled signal CS, another input coupled to an output of the inverter 82, and an output coupled to the enable terminal $n_{EN}$ of the oscillator RO2.

The logic AND gate 86 includes an input to receive the controlled signal CS1, another input coupled to an output of the logic AND gate 84, and an output coupled to the enable terminal $n_{EN}$ of the oscillator RO3.

In operation, since an input of the logic AND gate 84 is coupled to the output of the inverter 82, the oscillator RO2 is selectively enabled and the switches SW1-SW5 are conducted when the oscillator RO1 is enabled. Moreover, since an input of the logic AND gate 86 is coupled to the output of the logic AND gate 84, the oscillator RO3 is selectively enabled when the oscillator RO2 is enabled.

Figure 9:
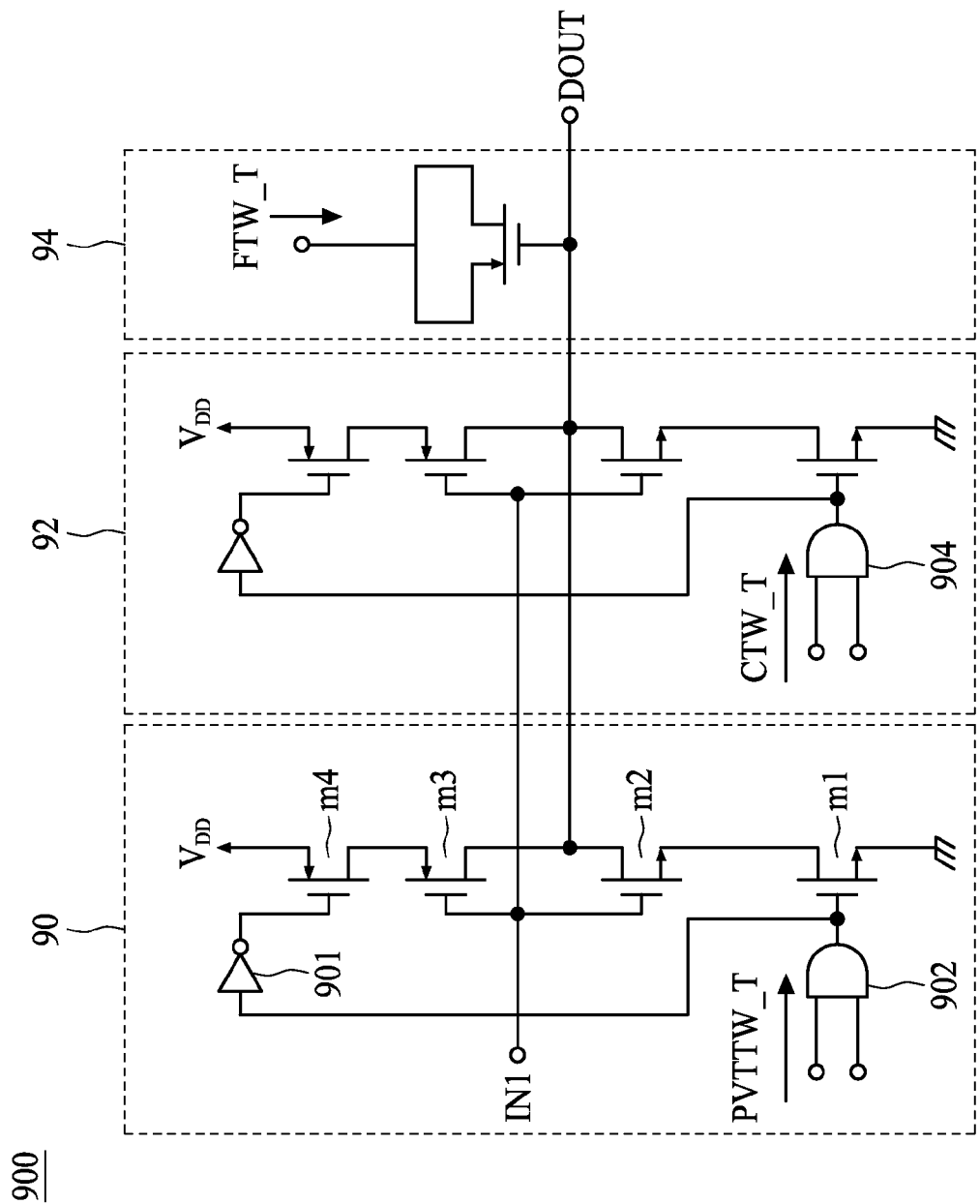
FIG. 9 is a circuit diagram of a delay cell, in accordance with some embodiments.

FIG. 9 is a circuit diagram of a delay cell 900, in accordance with some embodiments. The circuit structure of the delay cell 900 is suitable for use in the oscillators RO1, RO2 or RO3. Referring to FIG. 9, the delay cell 900 includes inverting devices 90 and 92 and a capacitive device 94.

The inverter 90 includes four transistors m1-m4, an inverter 901 and a logic AND gate 902. A first input of the logic AND gate 902 receives a tuning code PVTTW_T. In an embodiment, a second input of the logic AND gate 902 receives the detection signal PD as the delay cell 900 is used in the oscillator RO1. In another embodiment, the second input of the logic AND gate 902 receives the controlled signal CS as the delay cell 900 is used in the oscillator RO2. In yet another embodiment, the second input of the logic AND gate 902 receives the controlled signal CS1 as the delay cell 900 is used in the oscillator RO3. A source of the transistor m1 is coupled to a reference ground. A drain of the transistor m1 is coupled to a source of the transistor m2. A gate of the transistor m1 is coupled to an output of the logical AND gate 902 and an input of the inverter 901.

A drain of the transistor m2 is coupled to an output DOUT of the delay cell 900 and a drain of the transistor m3. A gate of the transistor m2 is coupled to an input IN1 of the delay cell 900.

A source of the transistor m3 is coupled to a drain of the transistor m4. A gate of the transistor m3 is coupled to the input IN1 of the delay cell 900 and the gate of transistor m2. A source of the transistor m4 is coupled to a supply voltage, for example, $V_{DD}$. A gate of the transistor m4 is coupled to an output of the inverter 901.

In operation, when the logic AND gate 902 provides a logically high output, the transistor m1 is conducted. Moreover, by function of the inverter 901, the gate of the transistor m4 is biased at a low logical value, turning on the transistor m4. When the transistors m1 and m4 are turned on, the transistors m2 and m3, which form an inverter pair, perform logic negation on the input IN1. As a result, the delay cell 900 provides an inversed signal at the output DOUT.

The circuit structure of the inverter 92 is similar to that of the inverter 90, except that, for example, an input terminal of a logic AND gate receives a tuning code CTW_T. The inverting device 92 operates in a similar fashion to the inverting device 90 and therefore is not discussed. In some embodiments, the inverting devices 90 and 92 are not allowed to operate at the same time.

Resolution of the oscillator signal CKV is determined by the capacitance of the capacitive device 94 and the wire capacitor, such as the capacitors $C_{L1}$, $C_{L2}$ or $C_{L3}$ in a stage, as expressed in equation (3) below.

$$\text{resolution} \propto \frac{C_{fine}}{C_{total}} \qquad \text{equation (3)}$$

where $C_{total}$ is the capacitance of an equivalent capacitor in a stage of a DCO. $C_{fine}$ is the capacitance of the capacitive device 94 in the stage of the DCO. According to equation (3), the resolution is directly proportional to $C_{fine}$, and inversely proportional to $C_{total}$. Since $C_{total}$ is determined by the wire capacitors in a stage, connection status of the wire capacitors is discussed with reference to FIGS. 10 and 11.

Figure 10:
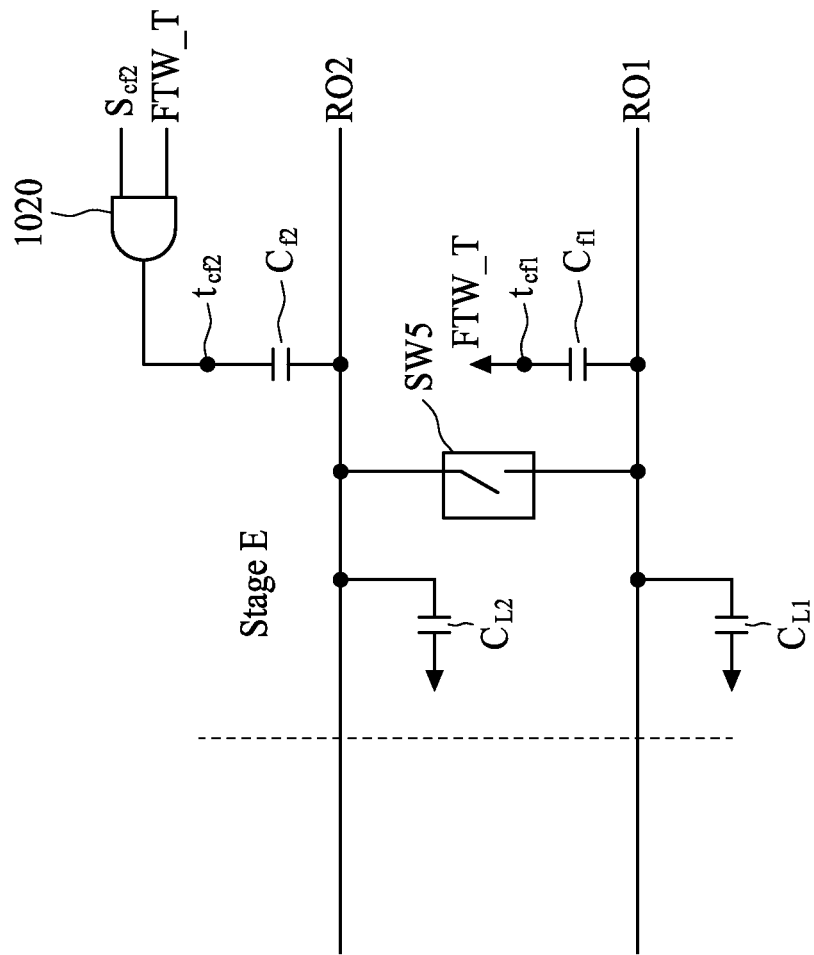
FIG. 10 is a schematic diagram illustrating a connection status between two oscillators, in accordance with some embodiments.

FIG. 10 is a schematic diagram illustrating a connection status between two oscillators, in accordance with some embodiments. Referring to FIG. 10 and also to FIG. 9, $C_{f1}$ represents an equivalent capacitor of the capacitive device in the stage E of the oscillator RO1, and $C_{f2}$ represents an equivalent capacitor of the capacitive device in the stage E of the oscillator RO2. The capacitor $C_{f1}$ is connected to the source terminal and the drain terminal of the capacitive device included in the oscillator RO1 at a terminal $t_{cf1}$. Moreover, the capacitor $C_{f2}$ is connected to the source terminal and the drain terminal of the capacitive device included in the oscillator RO2 at a terminal $t_{cf2}$.

In some embodiments, the oscillator RO1 is arranged to directly receive the tuning code FTW_T at the terminal $t_{cf1}$.

In some embodiments, the DCO 200 further includes a logic AND gate 1020. A first input of the logic AND gate 1020 receives a controlled signal $S_{cf2}$. A second input of the logic AND gate 1020 receives the tuning code FTW_T. An output of the logic AND gate 1020 is coupled to the terminal $t_{cf2}$.

The capacitor $C_{L1}$ and the capacitor $C_{L2}$ are selectively connected in parallel in response to a conduction state of the switch SW5 in order to adjust the resolution of an oscillator signal CKV provided by the DCO 200.

Moreover, the capacitor $C_{f1}$ and the capacitor $C_{f2}$ are also selectively connected in parallel in response to a conduction state of the switch SW5 in order to adjust the resolution of an oscillator signal CKV. In some embodiments, the capacitor $C_{f2}$ is selectively enabled in response to the controlled signal $S_{cf2}$. In this way, there are three options to select the resolution of the oscillator signal CKV, as can be expresses in equations (4)-(6) below.

$$\text{resolution} \propto \frac{C_{f1}}{C_{L1}} \qquad \text{equation (4)}$$

$$\text{resolution} \propto \frac{C_{f1}}{C_{L1} + C_{L2}} \qquad \text{equation (5)}$$

$$\text{resolution} \propto \frac{C_{f1} + C_{f2}}{C_{L1} + C_{L2}} \qquad \text{equation (6)}$$

Regarding equation (4), referring to FIG. 10 and also to FIG. 4A, the oscillator RO2 is not enabled and the switches SW1-SW5 are not conducted. As a result, the resolution of the oscillator signal CKV is determined by the capacitors $C_{L1}$ and $C_{f1}$.

Regarding equation (6), referring to FIG. 10 and also to FIG. 4B, the oscillator RO2 is enabled and the switches SW1-SW5 are conducted. The capacitor $C_{L2}$ is connected in parallel with the capacitor $C_{L1}$ and the capacitor $C_{f2}$ is connected in parallel with the capacitor $C_{f1}$. As a result, the resolution of the oscillator signal CKV is determined by the capacitors $C_{L1}$, $C_{L2}$, $C_{f1}$ and $C_{f2}$. The resolution of the oscillator signal CKV is inversely proportional to the resultant capacitance of the capacitors $C_{L1}$ and $C_{L2}$, and is directly proportional to the resultant capacitance of the capacitors $C_{f1}$ and $C_{f2}$.

Regarding to equation (5), referring to FIG. 10 and also to FIG. 4B, the oscillator RO2 is enabled and the switches SW1-SW5 are conducted. However, the capacitor $C_{L2}$ is not enabled in response to the controlled signal $S_{cf2}$.

As a result, the capacitor $C_{L2}$ is connected in parallel with the capacitor $C_{L1}$, and the capacitor $C_{f2}$ is not connected in parallel with the capacitor $C_{f1}$. Therefore, the resolution of the oscillator signal CKV is determined by the capacitor $C_{L1}$, $C_{L2}$ and $C_{f1}$.

Figure 11:
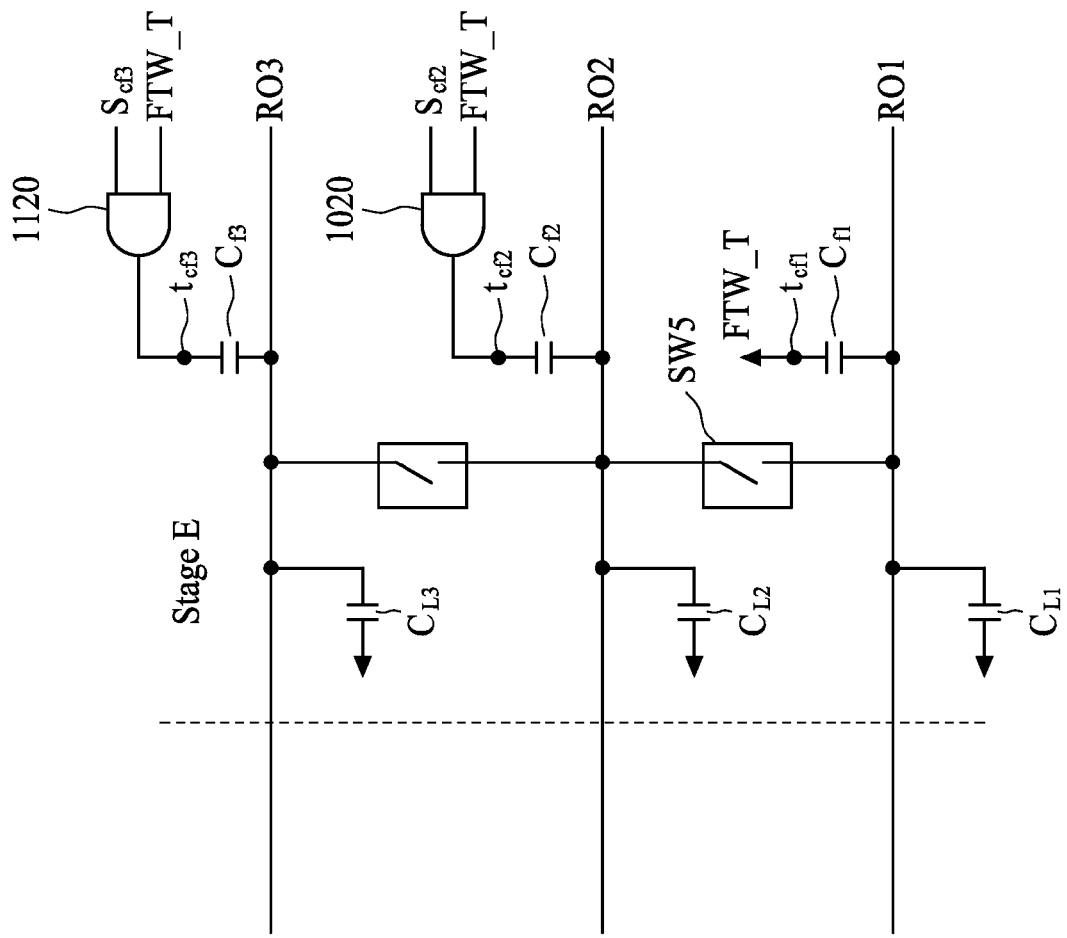
FIG. 11 is a schematic diagram illustrating a connection status between two oscillators, in accordance with some embodiments.

FIG. 11 is a schematic diagram illustrating a connection status between two oscillators, in accordance with some embodiments. The scenario in FIG. 11 is similar to that in FIG. 10, except that, for example, the scenario in FIG. 11 further includes the capacitor $C_{f3}$, which is the equivalent capacitor of the capacitive device in the oscillator RO3, further includes the capacitor $C_{L3}$ and a logic AND gate 1120.

A first input of the logic AND gate 1120 receives a controlled signal $S_{cf3}$. A second input of the logic AND gate 1120 receives the tuning code FTW_T. An output of the second logic AND gate is coupled to the terminal $t_{cf3}$.

In the scenario of FIG. 11, the DCO 800 can provide six options in selecting the resolution of the oscillator signal CKV. Among the six options, three of them are similar to those described and illustrated with reference to FIG. 10. More specifically, when the oscillators RO2 and RO3 are not enabled and all the switches are not conducted, the resolution can be expressed as equation (4). Moreover, when the oscillator RO3 is not enabled and the switches between the oscillator RO2 and RO3 are not conducted, the resolution can be expressed as equation (6). Furthermore, when the oscillator RO3 is not enabled, the switches between the oscillator RO2 and RO3 are not conducted and the capacitor $C_{f2}$ is not enabled, the resolution can be expressed as equation (5). The remaining three options are expressed in equations (7)-(9) below.

$$\text{resolution} \propto \frac{C_{f1}}{C_{L1} + C_{L2} + C_{L3}} \qquad \text{equation (7)}$$

$$\text{resolution} \propto \frac{C_{f1} + C_{f2}}{C_{L1} + C_{L2} + C_{L3}} \qquad \text{equation (8)}$$

$$\text{resolution} \propto \frac{C_{f1} + C_{f2} + C_{f3}}{C_{L1} + C_{L2} + C_{L3}} \qquad \text{equation (9)}$$

Regarding equation (7), the oscillators RO2 and RO3 are enabled. The switches between the oscillators RO1-RO2 and between the oscillators RO2-RO3 are conducted. The capacitor $C_{f2}$ is not enabled in response to the controlled signal $S_{cf2}$. The capacitor $C_{f3}$ is not enabled in response to the controlled signal $S_{cf3}$. The capacitors $C_{L1}$-$C_{L3}$ are connected in parallel. As a result, the resolution of the oscillator signal CKV is determined by the capacitors $C_{L1}$-$C_{L3}$ and $C_{f1}$.

Regarding equation (8), as compared with equation (7), the capacitor $C_{f2}$ is enabled in response to the controlled signal $S_{cf2}$. The capacitors $C_{f1}$ and $C_{f2}$ are connected in parallel. As a result, the resolution of the oscillator signal CKV is determined by the capacitors $C_{L1}$-$C_{L3}$ and $C_{f1}$-$C_{f2}$.

Regarding equation (9), as compared with equation (8), the capacitor $C_{f3}$ is enabled in response to the controlled signal $S_{cf3}$. The capacitors $C_{f1}$-$C_{f3}$ are connected in parallel. As a result, resolution of the oscillator signal CKV is determined by the capacitors $C_{L1}$-$C_{L3}$ and $C_{f1}$-$C_{f3}$.

The resolutions of the above-mentioned six scenarios are listed in Table 2 below.

TABLE 2

|  | $C_{L1}$ | $C_{L1} + C_{L2}$ | $C_{L1} + C_{L2} + C_{L3}$ |
|---|---|---|---|
| $C_{f1}$ | 550 kHz | 220 kHz | 137 kHz |
| $C_{f1} + C_{f2}$ | — | 490 kHz | 304 kHz |
| $C_{f1} + C_{f2} + C_{f3}$ | — | — | 488 kHz |

As shown in Table 2, three of the scenarios result in higher resolutions, 550 kHz, 490 kHz and 488 kHz, than the others. These resolutions are suitable for use in spread spectrum (SS) applications. FIG. 12A is a schematic diagram showing an exemplary signal before SS. In time domain, the frequency of the signal is about 3 GHz. FIG. 12B shows a spectrum of the signal of FIG. 12A. Power is centralized at a central frequency, such as 3 GHz, of the signal. Moreover, the power reaches its peak at the central frequency, measured 0 dBm. However, the bandwidth is relatively narrow. FIG. 12C is a schematic diagram showing the signal after SS. Referring to FIG. 12C, the frequency of the signal swings between a first frequency $f_1$, such as 3 GHz, and a second frequency $f_2$, such as 2.985 GHz, with a peak-to-peak time of approximately 30.33 µs. The bandwidth of the signal is about 5000 ppm. FIG. 12D shows a spectrum of the signal of FIG. 12C. Compared with FIG. 12B, power is spread and decreases from 0 dBm to −24 dBm. The bandwidth, determined by 3 GHz and 2.985 GHz, achieves 5000 ppm wider than the bandwidth shown in FIG. 12B in frequency domain.

Figure 13:
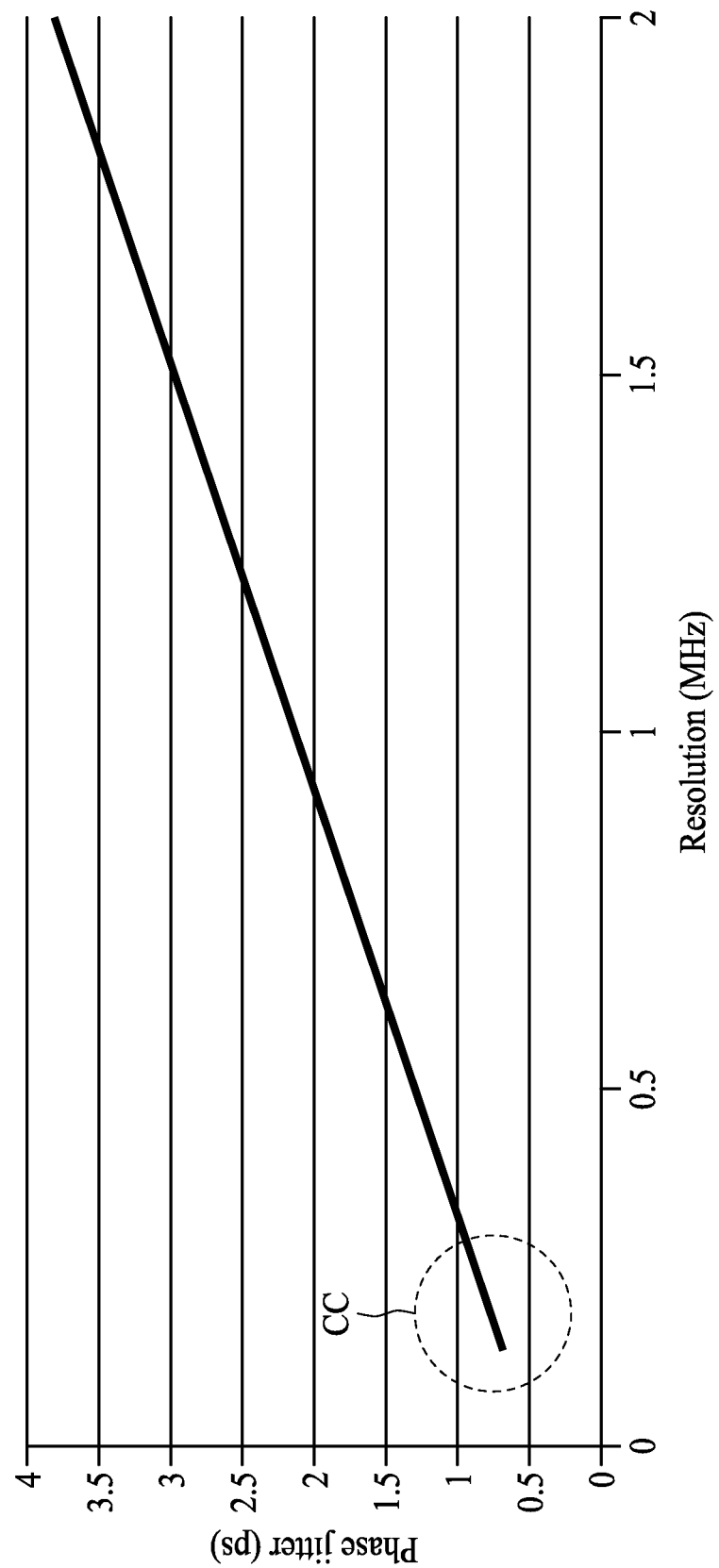
FIG. 13 is a diagram illustrating the relation between phase jitter versus resolution.

In some existing approaches, it is hard to reach a resolution less than 140 kHz. Nevertheless, in the present embodiment, the DCO 500 can provide the oscillator signal CKV with a resolution of approximately 137 kHz, which is lower than 140 kHz. Such low-resolution oscillator signal CKV can be applied to a low jitter application. FIG. 13 is a diagram illustrating the relation between phase jitter and resolution. Referring to FIG. 13, phase jitter decreases as resolution decreases. Effectively, oscillator signal CKV having a resolution of 137 KHz or 220 KHz, which falls with a low-resolution region as indicated by a dotted circle cc, can be applied to low jitter applications.

Referring back to FIG. 7, having more oscillators and more sets of switches, the DCO 700 can provide more options in selecting the resolution of the oscillator signal CKV than the DCO 500.

Figure 14:
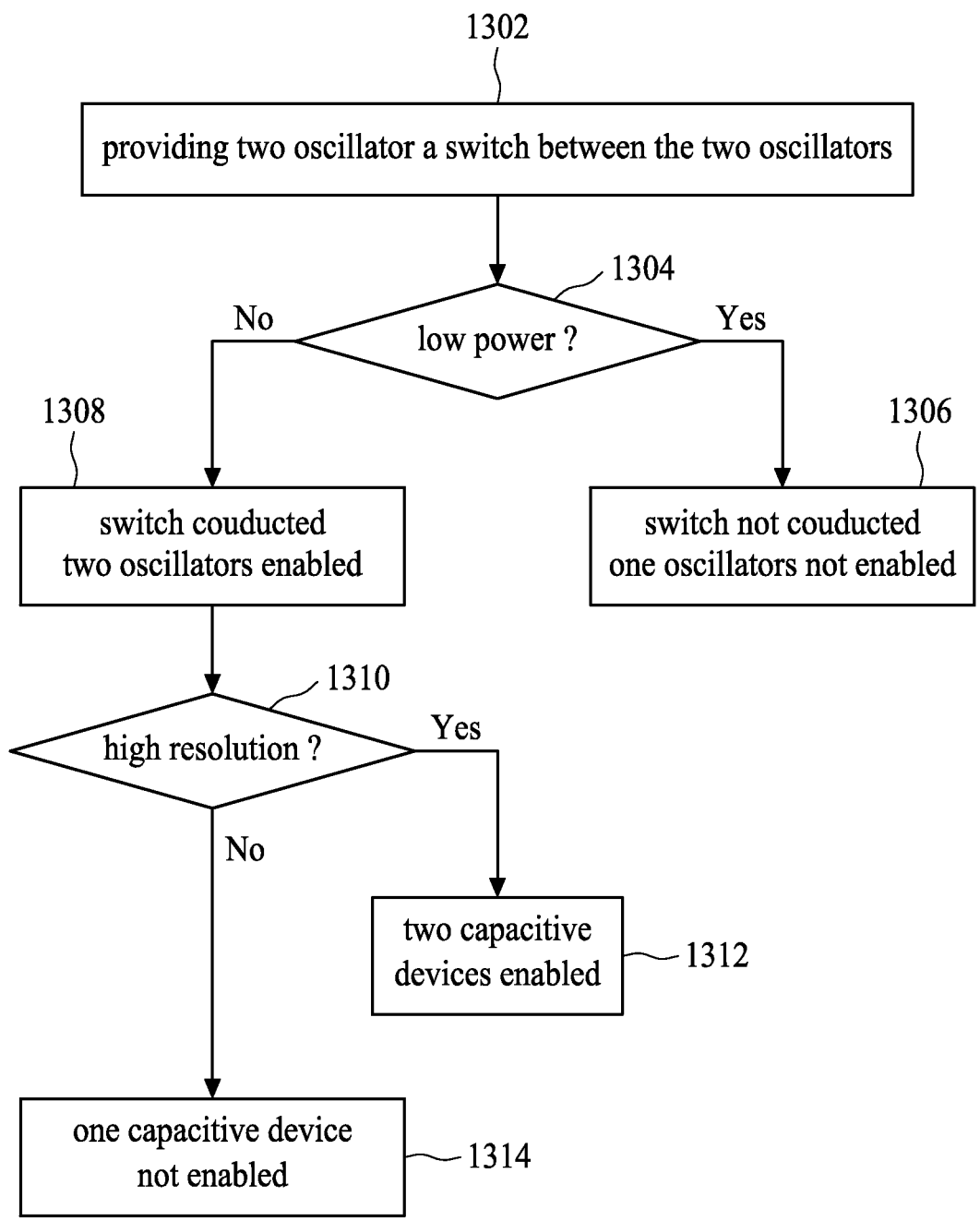
FIG. 14 is a flow diagram showing a method of generating an oscillator signal, in accordance with some embodiments.

FIG. 14 is a flow diagram showing a method of generating an oscillator signal, in accordance with some embodiments. Referring to FIG. 14, in operation 1302, also referring to FIG. 4A, two oscillators RO1 and RO2 are provided, and a switch is coupled between the two oscillators RO1 and RO2.

In operation 1304, it is determined whether the DCO is used for a low-power application. If affirmative, in operation 1306, the oscillator RO2 is not enabled and the switch is not conducted. And if not, in operation 1308, also referring to FIG. 4B, the oscillator RO2 is enabled and the switch is conducted.

Subsequent to operation 1308, in operation 1310, it is determined whether the oscillator signal CKV is used for a high-resolution application. If affirmative, in operation 1312, also referring to FIG. 10, the capacitive device of the oscillator RO2 is enabled. And if not, in operation 1314, the capacitive device of the oscillator RO2 is not enabled.

Figure 15:
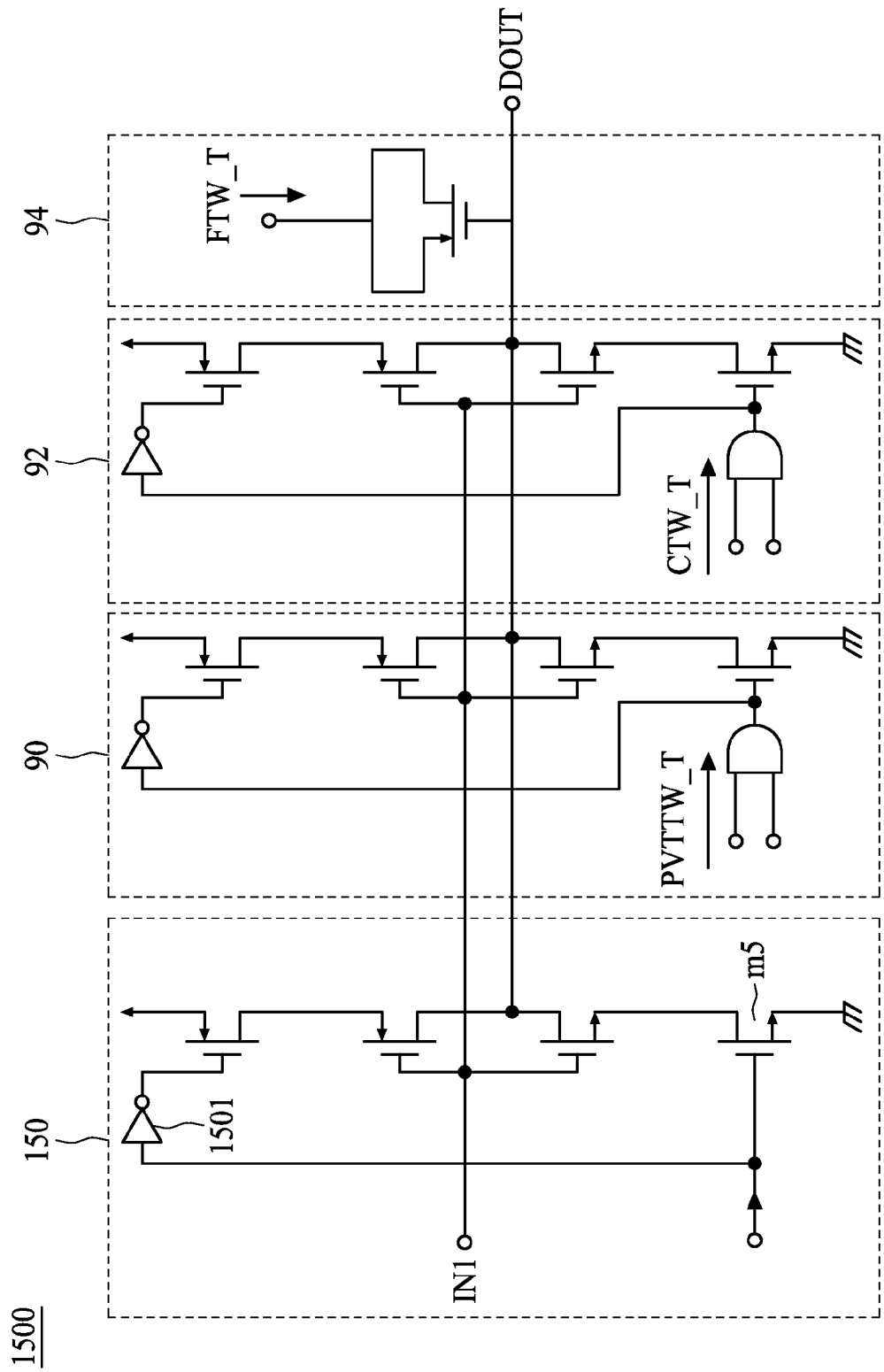
FIG. 15 is a circuit diagram of a delay cell, in accordance with some embodiments.

FIG. 15 is a circuit diagram of a delay cell 1500, in accordance with some embodiments. The delay cell 1500 is similar to the delay cell 900 described and illustrated with reference to FIG. 9 except that, for example, the delay cell 1500 further includes an inverting device 150. Moreover, the circuit structure of the inverting device 150 is similar to that of the inverting device 90 except that, for example, a gate of the transistor m5 and an input of the inverter 1501 are connected together to receive a signal, such as the detection signal PD, the controlled signal CS or the controlled signal CS1, depending on the configuration of an oscillator that includes the delay cell 1500.

Figure 16:
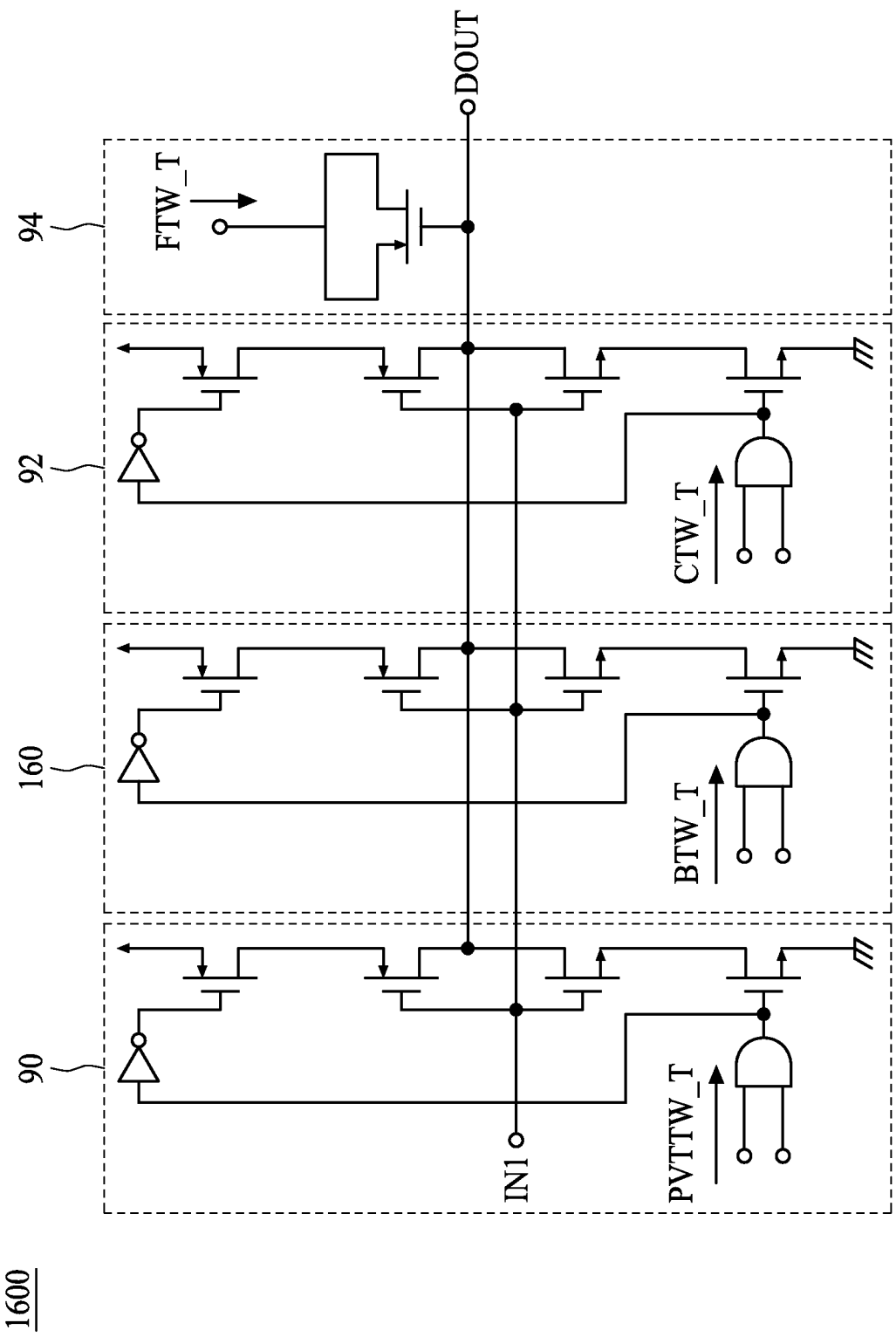
FIG. 16 is a circuit diagram of a delay cell, in accordance with some embodiments.

FIG. 16 is a circuit diagram of a delay cell 1600, in accordance with some embodiments. The delay cell 1600 is similar to the delay cell 900 described and illustrated with reference to FIG. 9 except that, for example, the delay cell 1600 further includes an inverting device 160. Moreover, the circuit structure of the inverting device 160 is similar to that of the inverting device 90 except that, for example, an input terminal of a logic AND gate receives a tuning code BTW_T (not shown in FIG. 1) from the across-stage DCO controller 142, and another input terminal of the logic AND gate receives a signal, such as the detection signal PD, the controlled signal CS or the controlled signal CS1, depending on the configuration of an oscillator that includes the delay cell 1600.

Figure 17:
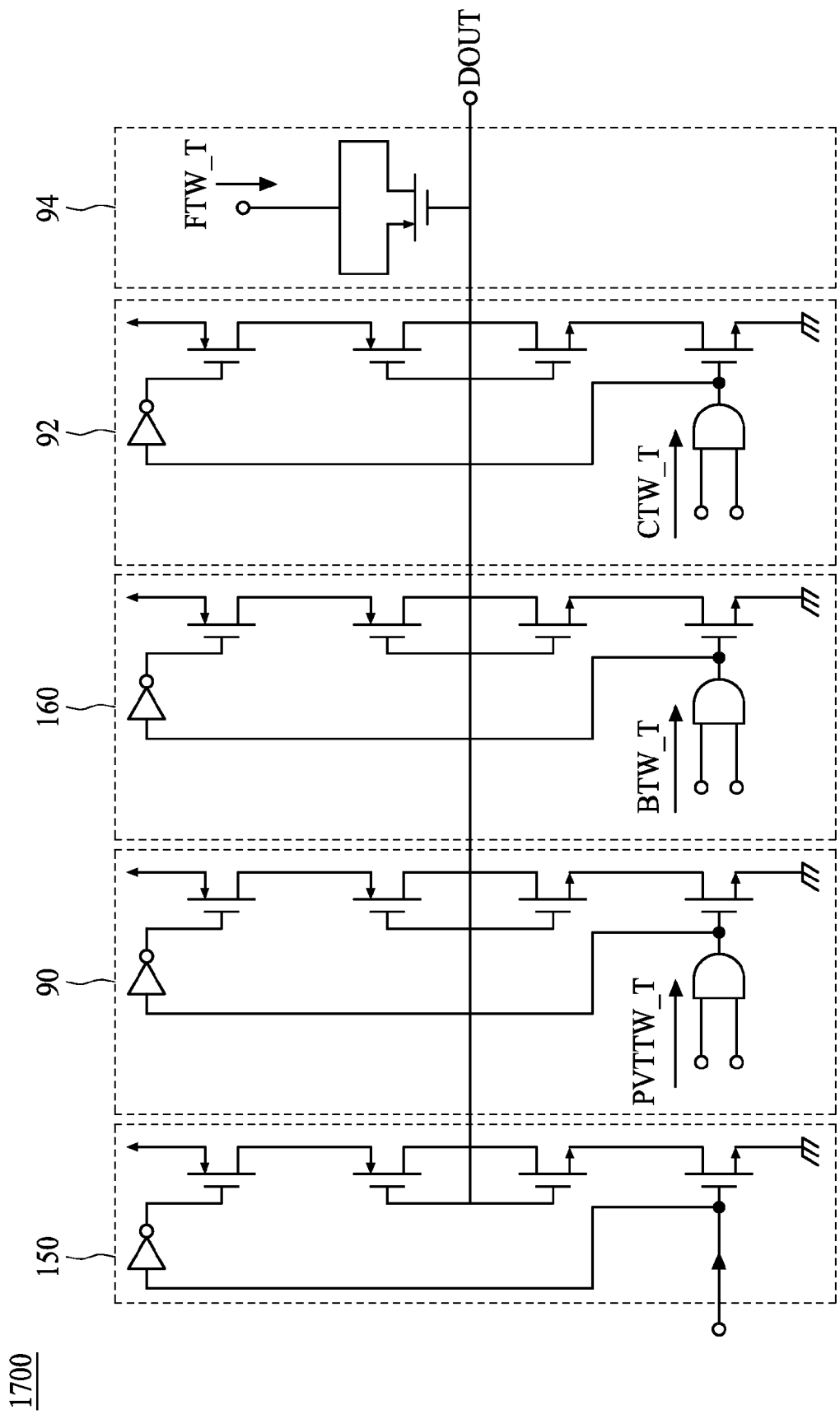
FIG. 17 is a circuit diagram of a delay cell, in accordance with some embodiments.

FIG. 17 is a schematic diagram circuit diagram of a delay cell 1700, in accordance with some embodiments. The delay cell 1700 is similar to the delay cell 1600 described and illustrated with reference to FIG. 16 except that, for example, the delay cell 1600 further includes the inverting device 150 as illustrated in FIG. 15.

Some embodiments have one or a combination of the following features and/or advantages. In some embodiments, a digitally controlled oscillator includes a first oscillator a second oscillator and a switch. The second oscillator is selectively enabled in response to a controlled signal. The switch is coupled between the first oscillator and the second oscillator and is selectively conducted in response to the controlled signal, so that an oscillator signal is provided by the first oscillator when the switch is not conducted, and provided by the first oscillator and the second oscillator when the switch is conducted.

In some embodiments, in a method, a digitally controlled oscillator (DCO), comprising a first oscillator a second oscillator and a switch coupled between the first oscillator and the second oscillator is provided. The second oscillator in response to a controlled signal is selectively enabled. The switch is selectively conducted in response to the controlled signal. An oscillator signal is provided by the first oscillator when the switch is not conducted. An oscillator signal is provided by the first oscillator and the second oscillator when the switch is conducted.

In some embodiments, in a method, a digitally controlled oscillator (DCO) is provided. The DCO includes a first oscillator, a second oscillator and a switch coupled between the first oscillator and the second oscillator. The DCO provides an oscillator signal having a first resolution. The first resolution is adjusted by selectively enabling a second oscillator in response to a controlled signal and by selectively conducting the switch in response to the controlled signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A digitally controlled oscillator (DCO), comprising:
a first oscillator;
a second oscillator, being selectively enabled in response to a controlled signal; and
a switch, coupled between the first oscillator and the second oscillator, being selectively conducted in response to the controlled signal, so that an oscillator signal is provided by the first oscillator when the switch is not conducted, and provided by the first oscillator and the second oscillator when the switch is conducted,
wherein the second oscillator includes a capacitive device arranged to adjust the resolution of the oscillator signal, and the capacitive device is, in response to a second controlled signal, selectively enabled when the switch is conducted and the second oscillator is enabled;
wherein the DCO provides the oscillator signal with a first resolution when the second oscillator is not enabled, the switch is not conducted and the capacitive device is not enabled; the DCO provides the oscillator signal with a second resolution when the second oscillator is enabled, the switch is conducted and the capacitive device is enabled; and the DCO provides the oscillator signal with a third resolution when the second oscillator is enabled, the switch is conducted and the capacitive device is not enabled.

2. The DCO as claimed in claim 1, wherein the first oscillator includes a first capacitor and the second oscillator includes a second capacitor, the first capacitor being selectively connected in parallel with the second capacitor in response to a conduction state of the switch.

3. The DCO as claimed in claim 2 exhibiting a first capacitance when the first capacitor is connected in parallel with the second capacitor, and exhibiting a second capacitance when the first capacitor is not connected in parallel with the second capacitor, the first capacitance being greater than the second capacitance.

4. The DCO as claimed in claim 2, wherein the amount of operation current in the first oscillator and the second oscillator when the first capacitor is connected in parallel with the second capacitor is larger than the amount of operation current in the first oscillator when the first capacitor is not connected in parallel with the second capacitor.

5. The DCO as claimed in claim 1, wherein at least one of the first or the second oscillator includes a ring oscillator.

6. A method, comprising:
providing a digitally controlled oscillator (DCO), the DCO including a first oscillator, a second oscillator and a switch coupled between the first oscillator and the second oscillator, wherein the second oscillator comprises a capacitive device;
selectively enabling the second oscillator in response to an enable signal;
selectively conducting the switch in response to the enable signal;
providing an oscillator signal by the first oscillator when the switch is not conducted;
providing an oscillator signal by the first oscillator and the second oscillator when the switch is conducted; and
selectively, in response to a second controlled signal, enabling the capacitive device when the switch is conducted and the second oscillator is enabled, and
providing, by the DCO, the oscillator signal with a first resolution when the second oscillator is not enabled, the switch is not conducted and the capacitive device is not enabled; providing, by the DCO, the oscillator signal with a second resolution when the second oscillator is enabled, the switch is conducted and the capacitive device is enabled; and providing, by the DCO, the oscillator signal with a third resolution when the second oscillator is enabled, the switch is conducted and the capacitive device is not enabled.

7. The method as claimed in claim 6, wherein the first oscillator includes a first capacitor and the second oscillator includes a second capacitor, further comprising:
selectively connecting the first capacitor in parallel with the second capacitor in response to a conduction state of the switch.

8. The method as claimed in claim 7, wherein the DCO exhibits a first capacitance when the first capacitor is connected in parallel with the second capacitor, and exhibits a second capacitance when the first capacitor is not connected in parallel with the second capacitor, the first capacitance being greater than the second capacitance.

9. The method as claimed in claim 7, wherein the amount of operation current in the first oscillator and the second oscillator when the first capacitor is connected in parallel with the second capacitor is larger than the amount of operation current in the first oscillator when the first capacitor is not connected in parallel with the second capacitor.

10. The method as claimed in claim 7, wherein at least one of the first or the second oscillator includes a ring oscillator.

11. A method, comprising:
providing a digitally controlled oscillator (DCO), the DCO including a first oscillator including a third capacitor, a second oscillator including a capacitive device and a switch coupled between the first oscillator and the second oscillator, and the DCO providing an oscillator signal having a first resolution; and
adjusting the first resolution by selectively enabling the second oscillator in response to a controlled signal and by selectively conducting the switch in response to the controlled signal, wherein adjusting the first resolution further comprises:
adjusting the first resolution by selectively connecting the third capacitor in parallel with the capacitive device in response to the conduction state of the switch; and
selectively enabling the capacitive device in response to a second controlled signal when the switch is conducted and the second oscillator is enabled;
adjusting the first resolution to a second resolution by enabling the second oscillator, connecting the third capacitor in parallel with the capacitive device and enabling the capacitive device; and adjusting the first resolution to a third resolution by enabling the second oscillator, and not enabling the capacitive device.

12. The method as claimed in claim 11, wherein the first oscillator includes a first capacitor and the second oscillator includes a second capacitor, wherein adjusting the first resolution further comprises:

adjusting the first resolution by selectively connecting the first capacitor in parallel with the second capacitor in response to a conduction state of the switch.

13. The method as claimed in claim 12, wherein adjusting the first resolution further comprises:

adjusting the first resolution to the second resolution lower than the first resolution by connecting the first capacitor in parallel with the second capacitor in response to the conduction state of the switch.

14. The method as claimed in claim 12, wherein adjusting the first resolution further comprises:

adjusting the first resolution to the second resolution lower than the first resolution by connecting the first capacitor in parallel with the second capacitor and connecting the third capacitor in parallel with the capacitive device in response to the conduction state of the switch.

15. The method as claimed in claim 14, wherein adjusting the first resolution further comprises:

adjusting the first resolution to the second resolution lower than the first resolution by connecting the first capacitor in parallel with the second capacitor and connecting the third capacitor in parallel with the capacitive device in response to the conduction state of the switch, and enabling the capacitive device in response to the second controlled signal; or adjusting the first resolution to the third resolution lower than the second resolution by connecting the first capacitor in parallel with the second capacitor in response to the conduction state of the switch, and not enabling the capacitive device in response to the second controlled signal.

16. The method as claimed in claim 15, wherein the capacitance of the first and the second capacitor is inversely proportional to resolution of the oscillator signal.

17. The method as claimed in claim 15, wherein the capacitance of the third and the capacitive device is proportional to resolution of the oscillator signal.

18. The DCO as claimed in claim 1, wherein the first resolution is higher than the second resolution, and the second resolution is higher than the third resolution.

19. The method as claimed in claim 6, wherein the first resolution is higher than the second resolution, and the second resolution is higher than the third resolution.

* * * * *